(12) United States Patent
Ono et al.

(10) Patent No.: US 8,334,519 B2
(45) Date of Patent: Dec. 18, 2012

(54) MULTI-PART SPECIMEN HOLDER WITH CONDUCTIVE PATTERNS

(75) Inventors: Shiano Ono, Kokubunji (JP); Masanari Koguchi, Kunitachi (JP); Ruriko Tsuneta, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 264 days.

(21) Appl. No.: 11/745,769

(22) Filed: May 8, 2007

(65) Prior Publication Data

US 2008/0067374 A1 Mar. 20, 2008

(30) Foreign Application Priority Data

May 11, 2006 (JP) .................................. 2006-132084

(51) Int. Cl.
*G01F 23/00* (2006.01)
*G21K 5/08* (2006.01)
*G21K 5/10* (2006.01)
(52) U.S. Cl. .................................. 250/440.11; 250/306
(58) Field of Classification Search .................. 250/306, 250/307, 310, 311, 440.11, 442.11; 269/47, 269/50
See application file for complete search history.

(56) References Cited

U.S. PATENT DOCUMENTS

| | | | | |
|---|---|---|---|---|
| 4,906,840 A * | 3/1990 | Zdeblick et al. | .................. | 850/1 |
| 5,120,925 A * | 6/1992 | Ohnishi et al. | ........... | 250/492.21 |
| 5,753,911 A * | 5/1998 | Yasuda et al. | ..................... | 850/1 |
| 6,946,656 B2 * | 9/2005 | Ezumi et al. | .................. | 250/306 |
| 7,491,934 B2 * | 2/2009 | Jesse et al. | ..................... | 250/310 |
| 2003/0042921 A1 * | 3/2003 | Hollman | ........................ | 324/754 |
| 2003/0127595 A1 * | 7/2003 | Nakamura et al. | ............ | 250/311 |
| 2003/0183776 A1 * | 10/2003 | Tomimatsu et al. | ...... | 250/442.11 |
| 2006/0025002 A1 * | 2/2006 | Zhang et al. | ................... | 439/329 |
| 2006/0128005 A1 * | 6/2006 | Hasegawa et al. | .......... | 435/286.2 |

FOREIGN PATENT DOCUMENTS

| | | |
|---|---|---|
| JP | 58-095562 | 6/1983 |
| JP | 06-310069 | 11/1994 |
| JP | 10-185781 | 7/1998 |
| JP | 11-108810 | 4/1999 |
| JP | 2003-035682 | 2/2003 |
| JP | 2005-091199 | 4/2005 |

OTHER PUBLICATIONS

Leist et al. ("Mobile sample holder applying multiple heating systems with a variable heating and cooling rate," Review of Scientific Instruments, vol. 74. No. 11. Nov. 2003 pp. 4772-4778).*

* cited by examiner

*Primary Examiner* — Robert Kim
*Assistant Examiner* — Brooke Purinton
(74) *Attorney, Agent, or Firm* — Antonelli, Terry, Stout & Kraus, LLP.

(57) ABSTRACT

In a specimen analyzing apparatus such as a transmission electron microscope for analyzing the structure, composition and electron state of an observing specimen in operation by applying external voltage to the specimen to be observed, a specimen support (mesh) including a mesh electrode connectable to external voltage applying portions of the specimen and a specimen holder including a specimen holder electrode connectable to the mesh electrode and current inlet terminals as well are provided. Voltage is applied externally of the specimen analyzing apparatus to the external voltage applying portions of the specimen through the medium of the specimen holder electrode and mesh electrode.

15 Claims, 17 Drawing Sheets

MULTI-PART SPECIMEN HOLDER WITH CONDUCTIVE PATTERNS

INCORPORATION BY REFERENCE

The present application claims priority from Japanese application JP2006-132084 filed on May 11, 2006, the content of which is hereby incorporated by reference into this application.

BACKGROUND OF THE INVENTION

The present invention generally relates to specimen analyzing apparatus represented by transmission electron microscopes and more particularly, to a specimen analyzing apparatus of the type capable of externally applying voltage or current to desired external voltage applying portions of various kinds of specimens as typified by semiconductor devices and a specimen holder for use in the specimen analyzing apparatus as well.

The specimen analyzing apparatus typified by a transmission electron microscope has high spatial resolution, for which a variety of attachable analytical functions have been developed, is very efficient as a tool for fault analysis and characteristic evaluation in various electronic devices such as semiconductor devices. As an example of the specimen analyzing apparatus, a conventional transmission electron microscope will be outlined with reference to FIGS. 2A and 2B. An electron beam 111 emitted from an electron gun 201 is accelerated by an anode 202 toward an electron lens, converged by a condenser lens 203 and then irradiated on a specimen 101. The electron beam 111 transmitting through the specimen 101 is enlarged by means of objective lens 204 and imaging lens 205 and projected on a fluorescent screen 206, so that the electron beam 111 can be visualized to enable a measurer to observe an image developing on the fluorescent screen 206. The specimen 101 is thinned in advance to a film having so small a thickness as to permit the electron beam 111 landing on the specimen to transmit therethrough and is then mounted to a specimen support (hereinafter termed a mesh 102). As shown in FIG. 2B, the specimen 101 is securely attached to the mesh 102 by using a specimen cap jig 207 and a specimen tap spring 208. Then, the specimen 101 seated on the mesh 102 is fixedly mounted to a specimen holder 106.

Typically, in measuring a specimen by using the specimen analyzing apparatus as typified by the transmission electron microscope, a specimen thinned to a film having so a small thickness as to enable a particle beam to transmit therethrough is prepared in advance of the measurement through a specimen preparation method using a specimen preparation unit such as a focused ion beam unit described in, for example, JP-A-11-108810 (Patent Document 1), that is, through a micro-sampling method. The micro-sampling method will now be described with reference to FIG. 3. In the micro-sampling process pursued in the specimen preparation unit such as focused ion beam unit, an ion beam is irradiated on an area of several tens of microns in which a desired observing portion is included, to separate a fine specimen piece 302 from a specimen 301 such as device chip or semiconductor wafer (at a in FIG. 3), the fine specimen piece 302 is picked out of the specimen by means of a manipulator 303 such as a probe (at b in FIG. 3), the picked out fine specimen piece 302 is mounted on a specimen carrier means 304 (at c in FIG. 3) and an ion beam is irradiated on the fine specimen piece 402 seated on the specimen carrier means 304 to produce a thin-film specimen including a desired observing portion 305 (at d in FIG. 3).

In conducting fault analysis and characteristic evaluation in a device by using the specimen analyzing apparatus, it is desirable for a phenomenon to be analyzed directly, which phenomenon takes place in the device being in operation under the application of external voltage to a specimen. For directly analyzing the phenomenon developing in the device with a desired portion of the specimen being connected to an external voltage power supply, JP-A-06-310069 (Patent Document 2) describes a method according to which an electrically conductive pattern is formed in advance on a specimen stand forming a part of specimen holder and a semiconductor specimen is mounted having its voltage terminal set in register with the conductive pattern on the specimen stand. Further, JP-A-10-185781 (Patent Document 3) describes a method in which a specimen per se is provided with an electrode, a current conduction terminal corresponding thereto is provided on a specimen holder and the specimen is pressed against the specimen holder by a specimen cap so as to be fixedly mounted. In addition, methods have hitherto been known including one for directly attaching a chip or a fine conductor to a thin-film specimen as disclosed in JP-A-2003-35682 (Patent Document 4) and another for applying external voltage to a specimen through many probes or styluses brought into contact with the specimen.

SUMMARY OF THE INVENTION

As described above, various studies have hitherto been made of the method in which the external voltage source is connected to a desired portion of specimen to place the device in operational condition and thereafter a phenomenon taking place in the device is analyzed directly. In the techniques shown in Patent Document Nos. 2 and 3, however, the shape of conductive structure and/or the shape of the specimen need to correspond to the shape of current conduction terminal provided for the specimen holder and/or the shape of the conductive pattern provided for the specimen stand forming a part of the specimen holder. In other words, there arises a problem that a specimen incommensurate with the current conduction terminal or the shape of the conductive pattern cannot be connected with the external power supply even if the specimen can be mounted to the specimen holder or specimen stand. Further, there arises another problem that since the difference in size is large between the specimen holder or specimen stand and the specimen, register-positioning of the specimen is difficult to perform when setting the specimen to the specimen holder or specimen stand.

In Patent Document 4, a thin-film specimen having so small a thickness as to enable a particle beam typified by an electron beam to transmit therethrough is picked out by using a focused ion beam and a fine conductor or chip is directly attached to the surface of the thin-film specimen, thereby ensuring that external voltage can be applied directly to the specimen and dynamic characteristics of a device can be analyzed and appraised. But, in the technique shown in Patent Document 4, because of direct attachment to the surface of the thin-film specimen, the fine conductor or chip juts out of the fine specimen piece and structurally, the strength of attachment is weak. To add, since the fine conductor or chip per se is bare, there is a possibility that during mount/dismount of the specimen to/from the specimen analyzing apparatus proper, the fine conductor or chip will be disconnected or cut off to be broken by vibrations applied to the thin-film specimen or conductive structures will be swung or waggled under the application of vibrations so as to be short-circuited, giving rise to a problem of troublesome exchange of the specimen. Furthermore, the geometrical dimension of the thin-film specimen picked out through the micro-sampling process generally approximates several hundreds of nanometers in thickness and about 10 microns in longitudinal length and therefore, in trying to apply a large number of conductive structures to the thin-film specimen, many conductors need to be applied within a narrow area and possibly, conductive structures tend to come in contact with one another and are short-circuited eventually.

Further, in Patent Document 5, a specimen provided with a plurality of electrodes is set in a scanning transmission electron microscope, probes or styluses are brought into contact with the individual electrodes and voltage is externally applied to the specimen through the medium of the styluses so that the internal structure of a device may be observed while evaluating the performance of electronic elements. In the technique shown in Patent Document 5, however, for establishment of electrical connection between the stylus and the specimen, the stylus needs to be pressed against the specimen, urging the specimen to be imparted with mechanical force. In measurement of specimens with the specimen analyzing apparatus typically represented by the transmission electron microscope, it is general practice to make, in advance of the measurement, a specimen a thin film having so small a thickness at to permit a particle beam to transmit therethrough and so, if the thin-film specimen makes direct contact with the stylus and is consequently applied with stress externally, the specimen per se is distorted because of its extreme thinness under even a weak force and there is a possibility that characteristics of a device contained in the specimen will be affected or the specimen will be broken down.

In the light of the above problems, a first object of the present invention is to provide a specimen analyzing apparatus, having the function to directly apply external voltage to external voltage applying portions of a specimen, which (1) can mount specimens of various sizes, especially fine specimens on a specimen holder easily and steadily irrespective of the shape of a specimen stand, (2) can exchange the specimen with ease, (3) can have a high degree of freedom of the conductive structure drag to the specimen and of the layout of the conductive structure to assure sufficient wiring strength and (4) can apply external voltage to a desired position on the specimen without imparting mechanical force to the specimen.

A second object of the present invention is to provide a specimen holder for use in the specimen analyzing apparatus, which can facilitate the application of external voltage to external voltage applying portions of an observing specimen in analyzing the specimen placed in operational condition.

To accomplish the above objects, according to the present invention, a specimen analyzing apparatus typified by a transmission electron microscope comprises a mesh including a mesh electrode connectable to external voltage applying portions of a specimen to be observed and a specimen holder including a specimen holder electrode connectable to the mesh electrode and current inlet terminals.

Then, the external voltage applying portion of the observing specimen is connected to the mesh electrode, the mesh electrode is connected to the specimen holder electrode and voltage or current is supplied externally of the specimen analyzing apparatus to the external voltage applying portion of the specimen to be observed by way of the specimen holder electrode and mesh electrode. Under this condition, the structure, composition and electron state of a device included in the observing specimen can be measured while keeping the device placed in operational condition.

In the specimen analyzing apparatus represented by a transmission electron microscope, external voltage can be applied to the specimen to be observed to ensure that the structure, composition and electron state of the device which remains placed in operational condition can be measured.

Other objects, features and advantages of the invention will become apparent from the following description of the embodiments of the invention taken in conjunction with the accompanying drawings.

DETAILED DESCRIPTION OF THE INVENTION

Embodiment 1

Figure 1:
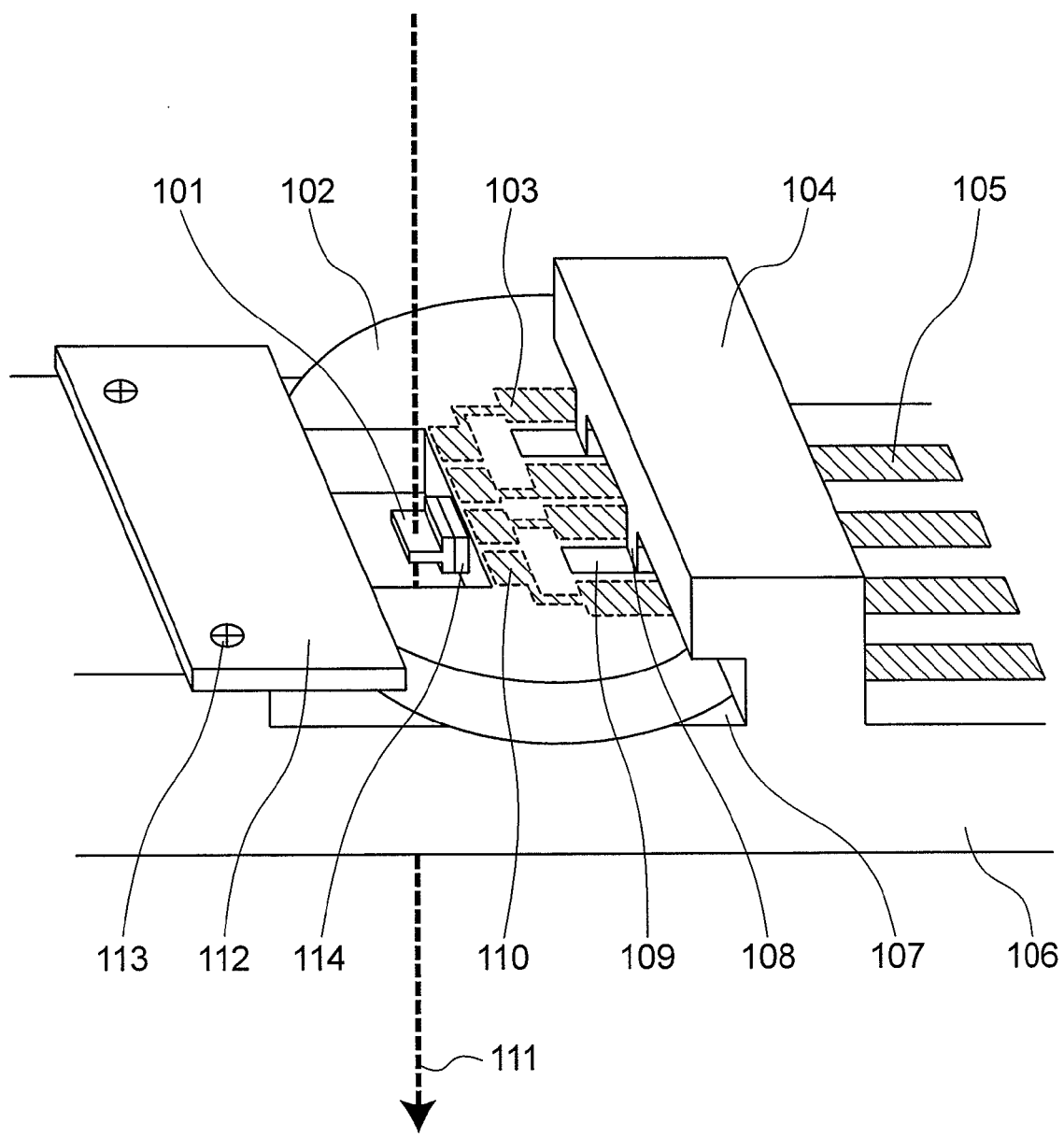
FIG. 1 is a perspective view illustrating an embodiment of a specimen analyzing apparatus according to the present invention.
Figure 2A:
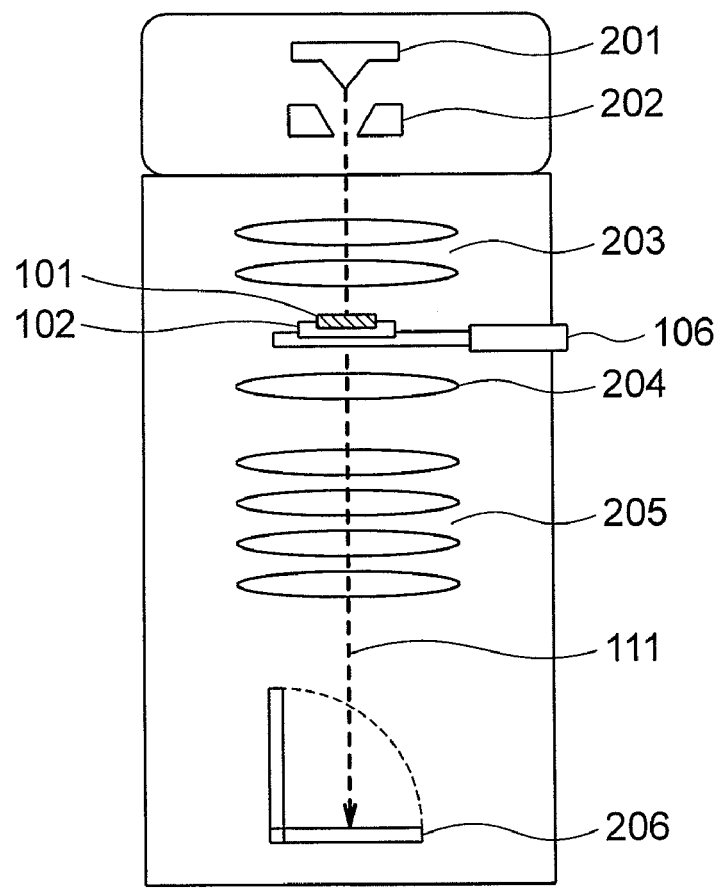
FIGS. 2A and 2B are diagrams useful to show the construction of a conventional transmission electron microscope.
Figure 2B:
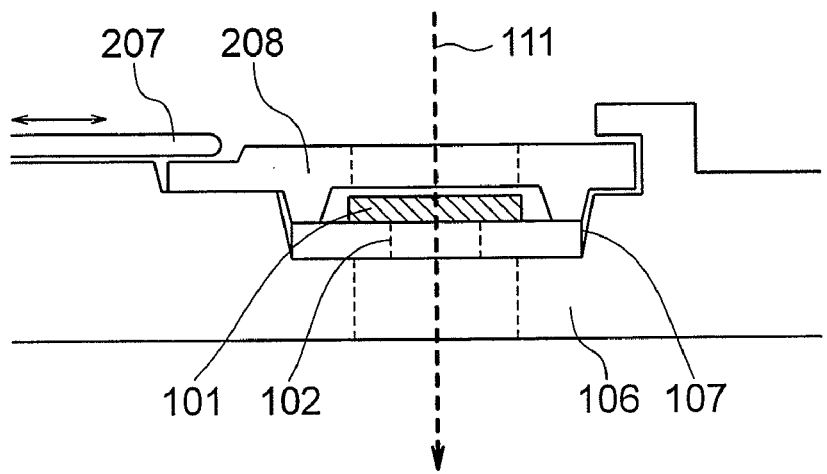
Figure 3:
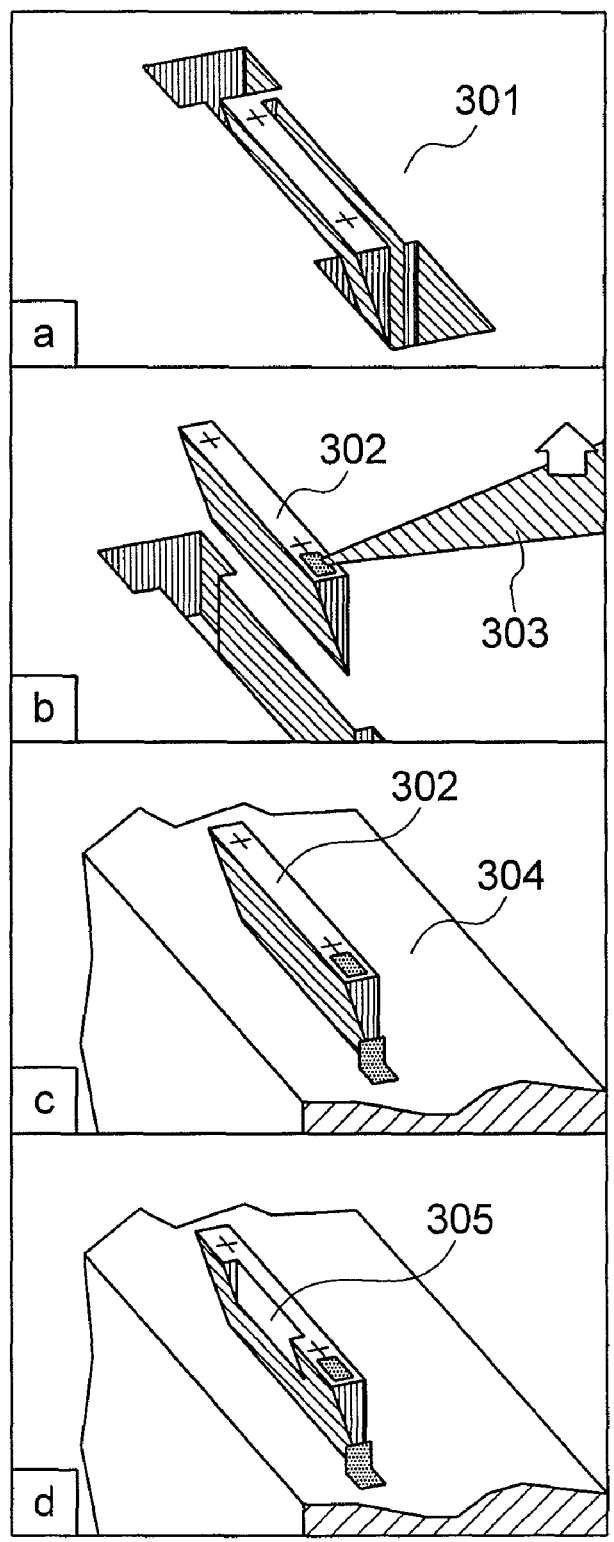
FIG. 3 is a perspective view for explaining an example of procedures of working an observing specimen with the conventional technology.

Referring first to FIG. 1, an embodiment of a specimen holder used for a specimen analyzing apparatus or the like is illustrated in perspective view form. A specimen support or mesh 102 has a single conductive structure/pattern or plural conductive structures/patterns (hereinafter referred to as a mesh electrode 103 including pad 110) connectable to an external voltage applying portion of a specimen to be observed. A mesh structure having the mesh electrode 103 will be detailed later in connection with embodiment 2.

A specimen 101 thinned precedently to a film having so a small thickness as to enable a particle beam typified by an electron beam to transmit therethrough is attached to the mesh 102 and the specimen 101 thus seated on or integral with the mesh 102 is mounted on a specimen holder 106. Alternatively, the mesh 102 may be mounted on the specimen holder 106 in advance and thereafter the thin-film specimen 101 may be attached to the mesh 102.

On the other hand, the specimen holder 106 has a single conductive structure/pattern or plural conductive structures/patterns (hereinafter referred to as a specimen holder electrode 105) connectable to the mesh electrode 103. With the mesh 102 mounted on the specimen holder, the mesh electrode 103 can be brought into connection to the specimen holder electrode 105. Preferably, as shown in FIG. 1, the specimen holder 106 may precedently be provided with the function to securely clamp the mesh 102 (a part of specimen holder having that function is especially termed a socket 104). In this case, by inserting the mesh 102 to the socket 104, the mesh 102 can be secured to the socket 104 and concurrently, connection of the mesh electrode 103 to the specimen holder electrode 105 can be completed. In this phase, if the socket 104 and a specimen support (mesh) receptacle 107 are also provided with conductive structures/patterns, respectively, and these structures/patterns are connected to the specimen holder electrode 105, electrode can be dragged freely on the socket 104 or specimen support receptacle 107. This is convenient for connection of a device specimen having a size of nanometer or micron order to a mesh having a size of millimeter order and especially can be taken advantage of by the case where the number of electrodes increases.

Accurate mount of the mesh 102 to a desired position of the specimen holder 106 is important from the standpoint of making the connection of mesh electrode 103 to the specimen holder electrode 105 steady. In a preferable example to this end, the mesh 102 is precedently shaped to have a dovetail-like fitting arrangement, the specimen holder is also shaped to have a groove or protrusion fitting arrangement commensurate with that of the mesh and they are put together through meshing engagement at the fitting arrangements to fixedly attach the mesh 102 to the specimen holder 106. More particularly, as shown in FIG. 1, the mesh 102 has a recessed or grooved guide 109 and the socket 104 forming a part of the specimen holder 106 has a raised guide 108 so that the mesh 102 may slidably be inserted to the socket 104 to assure meshing engagement of the guide contrivances, thereby accurately attaching the mesh 102 to a desired position of the socket 104.

Figure 4A:
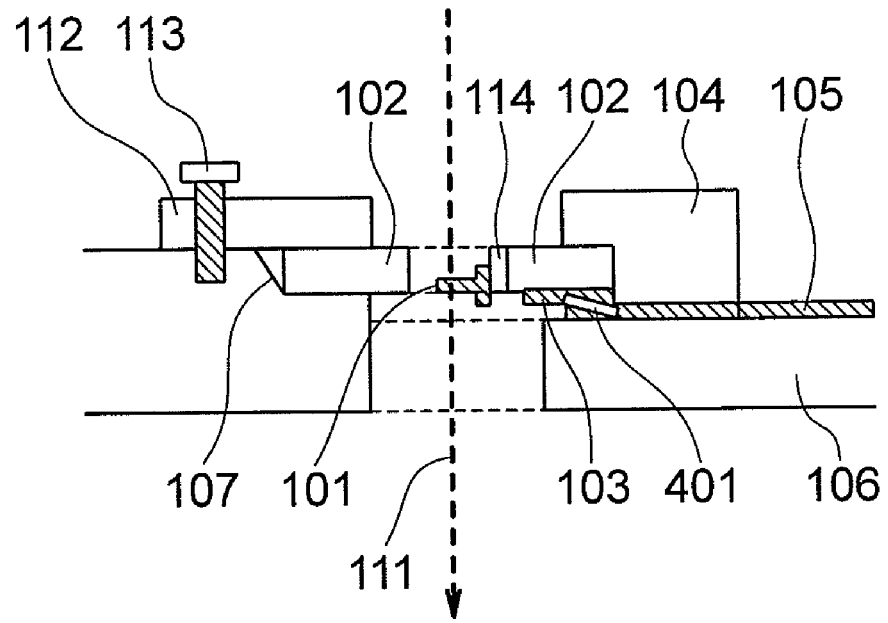
FIGS. 4A and 4B are sectional views illustrating details of the FIG. 1 specimen analyzing apparatus.
Figure 4B:
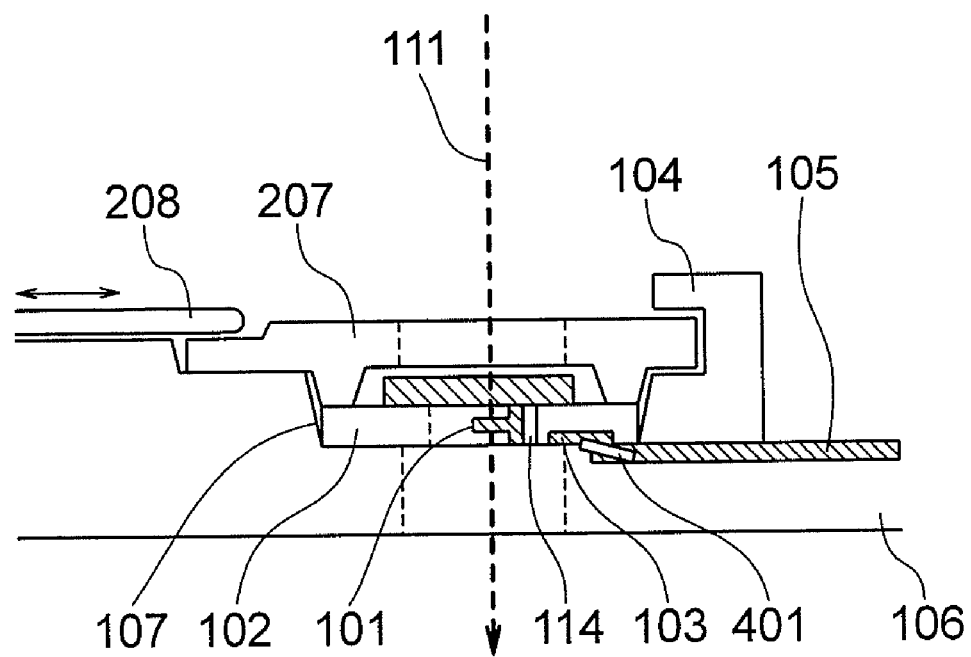
Figure 5A:
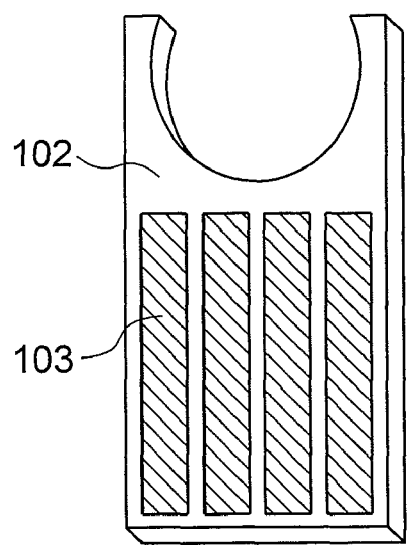
FIGS. 5A to 5G are diagrams showing embodiments of a specimen support according to the invention.
Figure 5B:
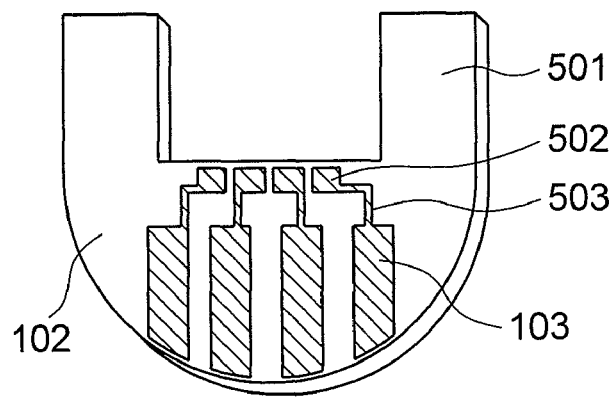

For specimen exchange, the mesh 102 is dismounted from the specimen holder and a new mesh is fixed to the specimen holder now to end a specimen exchange process, proving that the specimen can be exchanged easily within a short period of time. In this phase, by mounting the mesh 102 to the specimen holder 106 and thereafter tightly intimately fixing the two members, the mesh electrode 103 can be connected to the specimen holder electrode 105 more steadily and besides the mesh 102 can be prevented from falling off the specimen holder 106 under application of vibrations. The FIG. 1 arrangement is sectioned according to embodiments as illustrated in FIGS. 4A and 4B. In FIG. 4A, a method of fixing the mesh 102 to the specimen holder 106 is shown according to which the mesh 102 is interposed between a mesh cap 112 and the specimen holder 106 and the mesh cap 112 is screwed directly to the specimen holder 106 by using a mesh tap screw 113. In this method, the mesh tap screw 113 must be turned during mount and dismount and the mount/dismount work is laborious and time consuming but the possibility that the mesh 102 will fall off the specimen holder 106 under application of vibrations caused during mount and dismount can be reduced to advantage. In FIG. 4B, another method of fixing the mesh 102 to the specimen holder 106 is illustrated according to which the mesh 102 is interposed between a mesh cap 207 and the specimen holder 106 and the mesh cap 207 is held by a specimen tap spring 208. In this method, since the specimen is held by the "spring", the possibility that the mesh 102 will fall off the specimen holder 106 still remains but in comparison with the method shown in FIG. 4A for holding the specimen by the "screw", the mesh 102 can be fixed to the socket 104 relatively easily within a short period of time. In any of the instances shown in FIGS. 4A and 4B, with a view to making the connection between the mesh electrodes and specimen holder electrodes 103 and 105 steadier, a contact spring for electrodes 401 may be provided for either or both of the electrodes. In FIGS. 4A and 5B, the contact spring for electrodes 401 is exemplified as being a leaf spring but obviously, this is not limitative and another kind of spring such as flush spring or coil spring may also be used.

In the specimen analyzing apparatus according to the present invention, by intervening as an intermediate medium the mesh provided with the mesh electrode between the specimen holder and the specimen, the specimen need not be mounted directly on the specimen holder or the specimen stand forming a part of the specimen holder, so that even a specimen of any size can be mounted to the specimen stand or specimen holder by suitably choosing the mesh electrode provided for the mesh and besides the external power supply can be connected.

Embodiment 2

In the present embodiment, the structure of the mesh in embodiment 1 will be described in greater detail.

Embodiments of the mesh 102 are illustrated in FIGS. 5A to 5G. In an embodiment shown in FIG. 5A, the mesh 102 is shaped to a form mountable and dismountable to/from the specimen holder and this form is not limited to be circular or elliptical but may be of either polygonal form or circular or elliptical form in combination with polygonal form. In another embodiment shown in FIG. 5B, the mesh 102 is provided with a handle 501 for the convenience of an operator engaged in mount/dismount of the mesh 102 to/from the specimen holder.

The mesh 102 has a mesh electrode 103 of a single conductive structure/pattern or plural conductive structures/patterns. Since the mesh electrode 103 is built in the mesh 102 in advance, a specimen to be observed can be fixedly attached on the mesh 102 to be integral therewith. Accordingly, such a structure that a fine lead conductor or chip juts out of the specimen can be dispensed with and consequently, the strength of attachment between the conductive structures and the specimen can be assured. Even when vibrations are applied to the mesh, conductive structures can remain stationary to avoid contact or short-circuit therebetween, thus structurally having the ability to withstand vibrations. Further, in comparison with the expedient of setting up "floating" conductive structure as in Patent Document 4, the degree of freedom of conductive structure dragging on the specimen can be increased. This is very efficient especially for the case where a great number of conductive structures are applied to a fine specimen.

The mesh electrode 103 is shaped to be, for example, rectangular or square unlimitedly and may alternatively be polygonal. When the mesh electrode 103 includes a single pad or plural pads 502, electric connection between an arbitrary portion of the specimen to be measured and the mesh electrode 103 can be facilitated. Further, by narrowing the mesh electrode 103 partly to form a fine mesh electrode 503, connection between a device specimen having a size of nanometer or micron order and a mesh 102 having a size of millimeter order can be established conveniently and besides an increased number of electric channels can be dealt with handily.

The front surface and rear surface of the mesh will now be defined as below. More particularly, the surface confronting the generation source of charged particles (in the case of an electron microscope, the electron gun) arranged inside the specimen analyzing apparatus is defined as a front surface and the turned over surface a rear surface. The mesh electrode 103 (hereinafter, the pad 502 may merge into the fine conductive structure 503 in the mesh electrode 103 in the present embodiment) may be provided on only one side surface or either the front or rear surface of the mesh 102 or on both sides of front and rear surfaces of the mesh 102. Since the mesh electrode 103 bared on the front surface of the mesh will possibly be affected by electrification the charged particles cause during evaluation and analysis, a countermeasure for keeping the charged particles from directly bombarding the mesh electrode 103 must be taken. For example, respective conductive structures of the mesh electrode 103 may partly or wholly embedded in the mesh 102 or an electrically conductive film for blocking electron beam (the conductive film for blocking electron beam will be detailed in connection with embodiment 7) may be provided for the mesh.

Figure 5C:
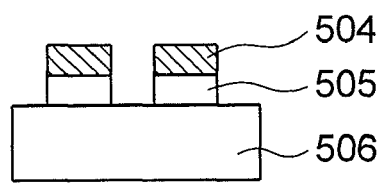
Figure 5D:
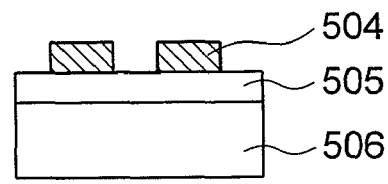
Figure 5E:
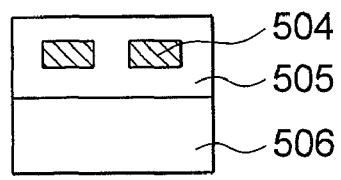
Figure 5F:
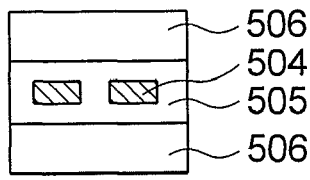
Figure 5G:
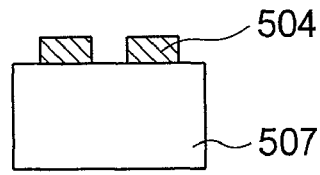

Examples of cross-sectional view of the mesh 102 are illustrated in FIGS. 5C to 5G. The mesh electrode 103 is electrically isolated from the body of mesh 102 and therefore, when a mesh electrode 103 having many conductive structures is laid on the mesh 102, individual conductors of the mesh electrode 103 need to be electrically isolated from the mesh. Accordingly, as shown in FIGS. 5C and 5D, the surface of electrically conductive mesh 506 is partly or totally covered with an insulating film 505 and a conductive film 504 is formed on part or whole of the insulating film, thus forming a mesh electrode 103. In this case, the insulating film may be formed by depositing boron nitride through CVD process and the conductive film may be prepared in the form of a pattern of carbon film. In an alternative, as shown in FIG. 5E, the insulating film 505 may be expanded to encompass part or whole of the conductive film 504. In an example shown in FIG. 5F, the conductive film 504 is partly or totally sandwiched between two sheets of mesh 506 and a resultant structure is used as a mesh electrode 103 in which the conductive films of conductive structure the mesh electrode has can be prevented structurally from being bared externally and so can be protected from externally attacking abrasion and the effect of electrification by the charged particle beam. Furthermore, film conductors 504 are formed directly on the surface of an insulating or dielectric mesh as in an example shown in FIG. 5G or film conductors 504 are formed internally of the insulating mesh, thus forming a mesh electrode 103 which is simplified in structure.

The conductive structure/pattern of mesh electrode 103 made to be electrically isolated from the mesh and from one another through the aforementioned processes will hereinafter be referred to as independent mesh electrode 103'.

Embodiment 3

In the present embodiment, "a method for picking out a thin-film specimen from a semiconductor wafer" and "a method for fixing a thin-film specimen to a mesh" will be described. In the former method, a specimen thinned to a film through mechanical process based on dicer or polishing may be picked out or a specimen thinned to a film through a work using a focused ion beam may be picked out. Especially, in the latter work using a focused ion beam, a "micro-sampling method" to be described later can be employed through the use of which a series of processes of picking out a thin-film specimen from a device chip or semiconductor wafer and fixing the specimen to a mesh can be executed by means of a single specimen preparation unit. The specimen preparation unit will be described with reference to FIG. 6 and a thin-film specimen preparation method based on the micro-sampling process will be detailed with reference to FIGS. 7 and 8.

Figure 6:
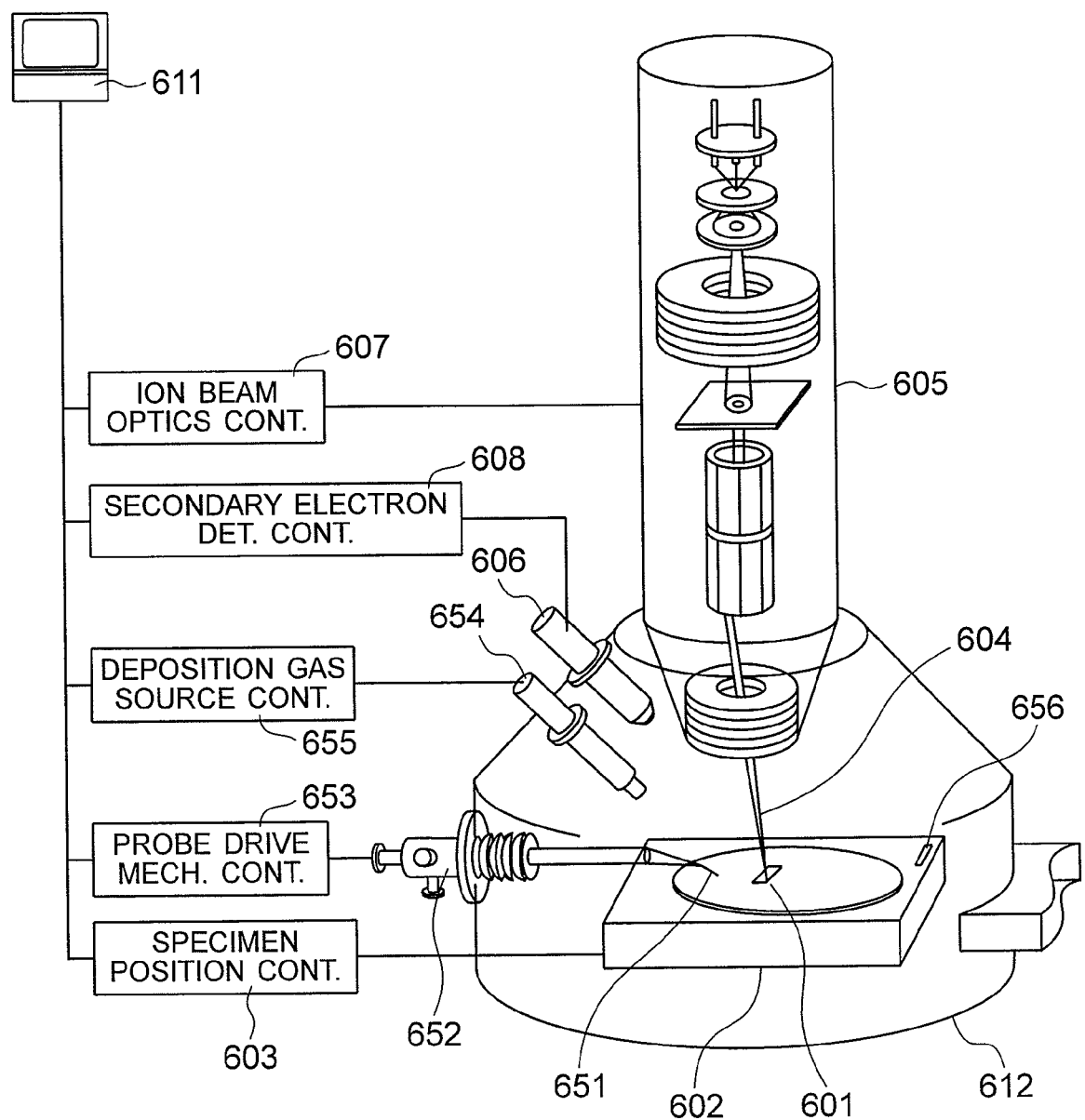
FIG. 6 is a functional schematic diagram showing an embodiment of the construction of a specimen preparation unit for visually forming a section of a specimen to be observed.

Firstly, an example of the construction of the specimen preparation unit will be described by making reference to FIG. 6. The specimen preparation unit includes a movable specimen stage 602 on which a specimen substrate such as a device chip or semiconductor wafer 601 is mounted, a specimen position controller 603 for controlling a position of specimen stage 602 at which the observation and work position of the wafer 601 is specifically determined, an ion beam optical system 605 for illuminating or irradiating an ion beam 604 on the wafer 601 to work it and a secondary electron detector 606 for detecting secondary electrons from the wafer 601. The ion beam optics 605 is controlled with an ion beam optics controller 607 and the secondary electron detector 606 is controlled by means of a secondary electron detector controller 608. Also provided is a deposition gas source 654 which is controlled by a deposition gas source controller 655. For example, tungsten carbonyl ($W(CO)_6$) is used as a deposition material but this material is not limitative. There is also provided a probe 651 for specimen pick-out. The probe has a submicron fine fore end. A specimen carrier for fixing a picked-out specimen piece is mounted to a specimen carrier support 656. The specimen position controller 603, ion beam optics controller 607, secondary electron detector controller 608 and deposition gas source controller 655 are under the control of a central processing unit 611. The specimen stage 602, ion beam optics 605, secondary electron detector 606, probe 651 for specimen piece pick-out, deposition gas source 654 and sample carrier support 656 are housed in a vacuum container 612. In the case of the specimen being a wafer, the wafer can be observed as it is, giving rise to an advantage that the address of a desired observation position can be managed easily and the wafer can be transported as it is from the inspection apparatus.

Figure 7:
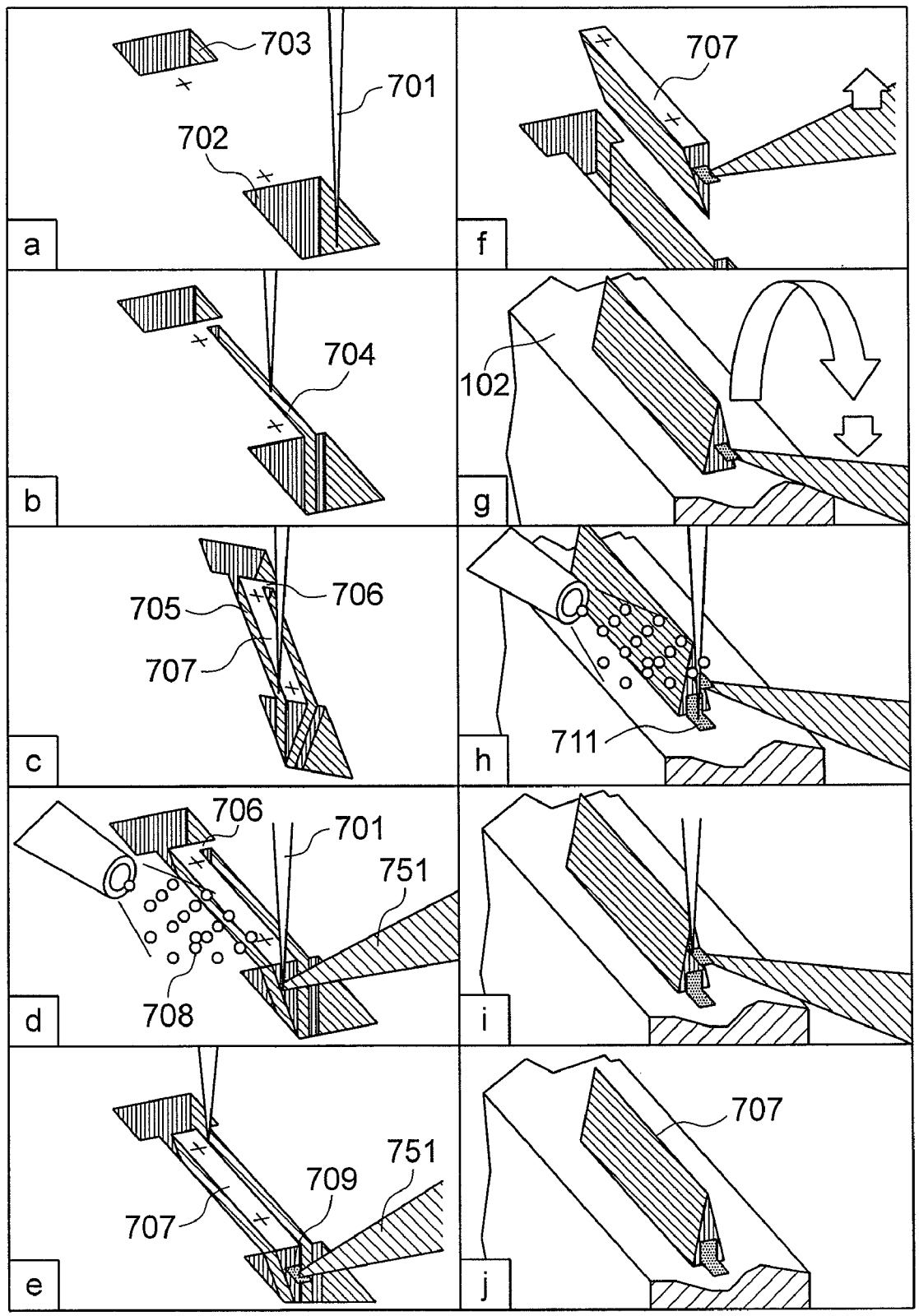
FIG. 7 is a perspective view useful to explain an embodiment of procedures of working an observing specimen according to the invention.

An example of procedures for working a thin-film specimen is shown in FIG. 7.

(a, b): Firstly, along three sides surrounding a desired section, three rectangular holes 702, 703 and 704 are bored with a focused ion beam 701.

(c): Next, the specimen carrier is tilted and a groove 705 is formed, so that a specimen piece 707 held by only a support 706 to the original specimen can be prepared.

(d): Next, the tilted specimen carrier is returned to the original posture and a fore end of probe 651 (FIG. 6) is brought into contact with the specimen piece 707 by means of a probe drive mechanism 652 which is controlled by means of a prove drive mechanism controller 653 (FIG. 6). Subsequently, while supplying a deposition gas 708 from the deposition gas source 654 (FIG. 6), the focused ion beam 701 is irradiated on an area including the probe fore end.

(e): Under the irradiation, a deposition film 709 can be formed and the specimen piece 707 and probe 651 can be fixed. Thereafter, the support 706 is removed through the focused ion beam process and as a result, the specimen piece can be separated from the original specimen.

(f, g): The separated specimen piece 707 is abutted against the mesh 102 while being turned upside down. Through this, the side of the specimen piece confronting the substrate is turned upwards and the opposite side comes into contact with the mesh 102.

(h): Then, the contact portion is irradiated with the focused ion beam in a way similar to the above to form a deposition film 711, thus fixing the specimen piece 707 to the mesh 102.

(i): Thereafter, the fore end of the probe is worked by the focused ion beam to separate the probe.

(j): In this manner, an independent specimen piece 707 can be obtained.

Figure 8:
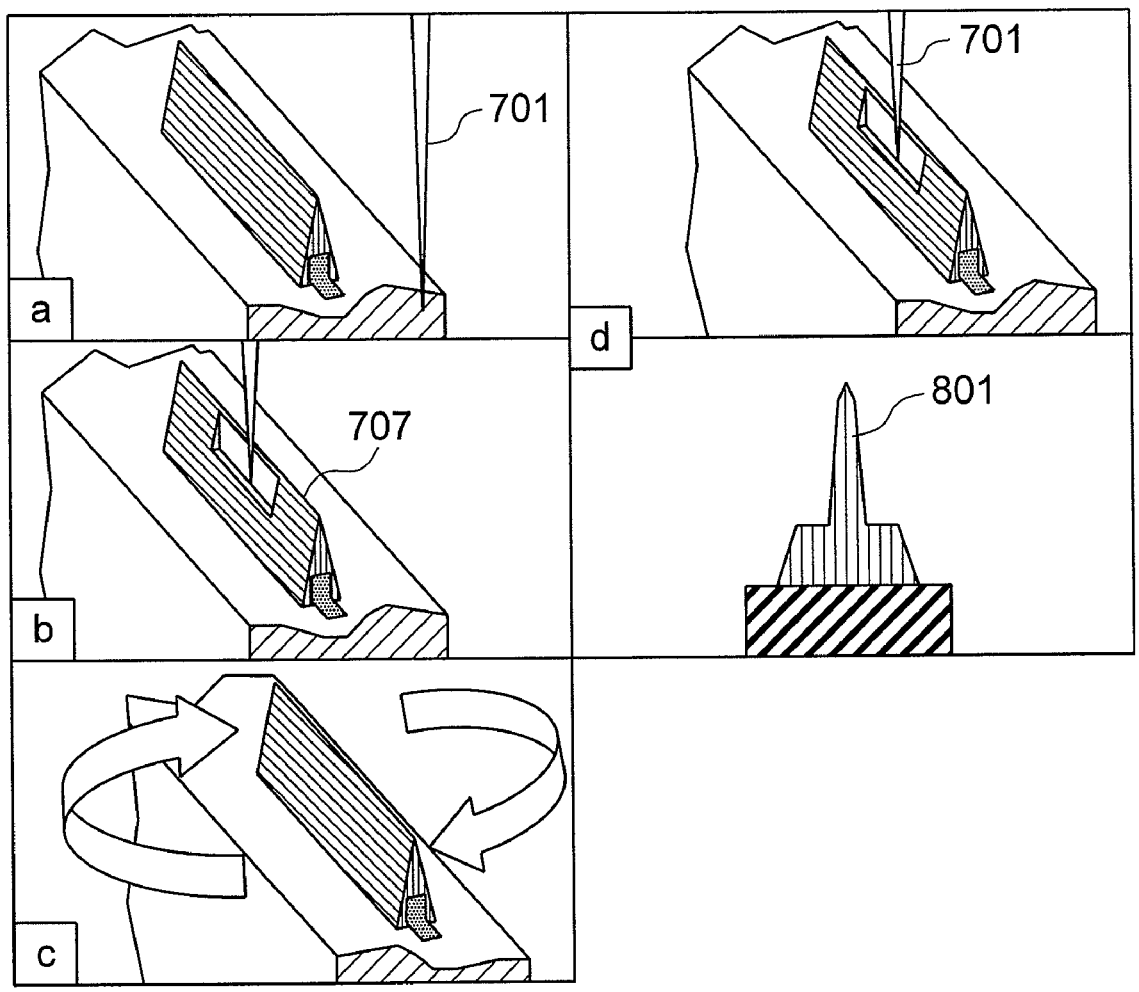
FIG. 8 is a perspective view useful to explain an embodiment of visual formation of a section of a specimen to be observed according to the invention.

An example of thin-film specimen section visualizing procedures is illustrated in FIG. 8.

(a, b): A focused ion beam 701 is irradiated in parallel with a desired section so that a desired section 801 may be so worked as to be exposed.

(c, d): Subsequently, the specimen is rotated through 180° and the above procedure is executed on the opposite side of the specimen. A thus obtained section of the specimen is depicted along with the previously obtained section at (d). By disposing the specimen piece 707 on the mesh 102 while turning it upside down as shown at (g) in FIG. 7, the contact area between the obtained specimen and the mesh 102 can be increased. Thus, the connection strength between the two members can be promoted to enhance the rigidity and so the possibility that the specimen piece will fall off the mesh can be decreased to a great extent.

In conducting the aforementioned thin-film specimen preparation process, it may be possible that only a mesh is introduced into the specimen preparation unit, a thin-film specimen 101 is attached to the mesh 102 inside the specimen preparation unit and thereafter the specimen 101 seated on the mesh 102 is mounted on the specimen holder 106 inside or outside the specimen preparation unit or alternatively, it may be possible that a mesh 102 is mounted on the specimen holder 106 in advance so as to be introduced, as a side entry type specimen holder in common use with the specimen analyzing apparatus, into the specimen preparation unit and a specimen 101 thinned to a film is attached to the mesh inside the specimen preparation unit.

Incidentally, when analyzing/evaluating specimens practically, there is a possibility that a specimen to be measured will touch gas typified by the atmospheric air, liquid or vapor and so the specimen surface will be oxidized or contaminated. To cope with this possibility, the functions both the specimen preparation unit and the specimen analyzing apparatus have can be incorporated into a single apparatus in order that a series of steps ranging from the specimen preparation process to the specimen analysis/evaluation can be carried out sequentially inside the single apparatus. Realization of the single apparatus as above can be allowed by, for example, using the electron microscope, including the transmission electron microscope and scanning electron microscope described in other embodiments, in combination with the focused ion beam unit. Thus, the specimen preparation, the connection of an external voltage applying portion of specimen to the external power supply and the specimen analysis/evaluation can be proceeded with in parallel by means of a single apparatus, leading to reduction of the time required for specimen analysis. Further, since the specimen surface can be protected from being oxidized and contaminated by evacuating the interior of the apparatus to vacuum, the specimen analysis/evaluation can be performed more accurately.

Figure 9A:
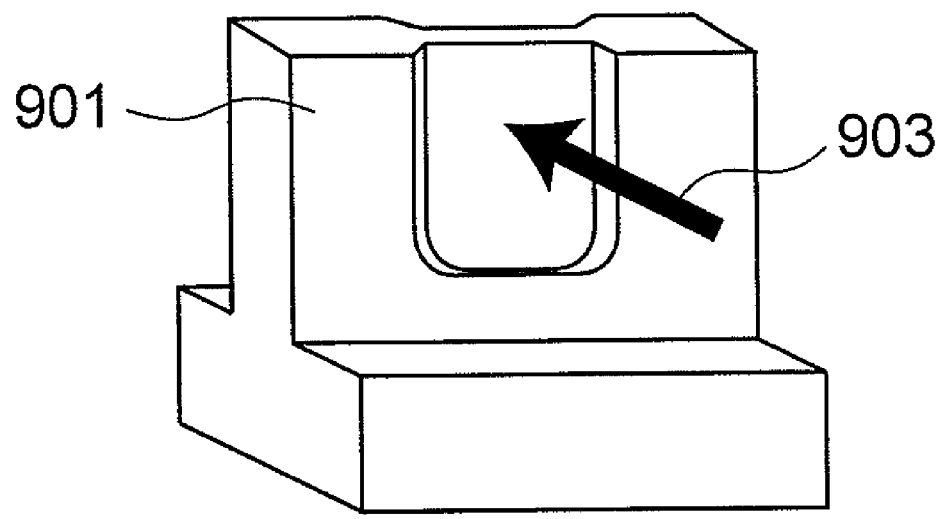
FIGS. 9A and 9B are perspective views of embodiments of the shape of observing specimen.
Figure 9B:
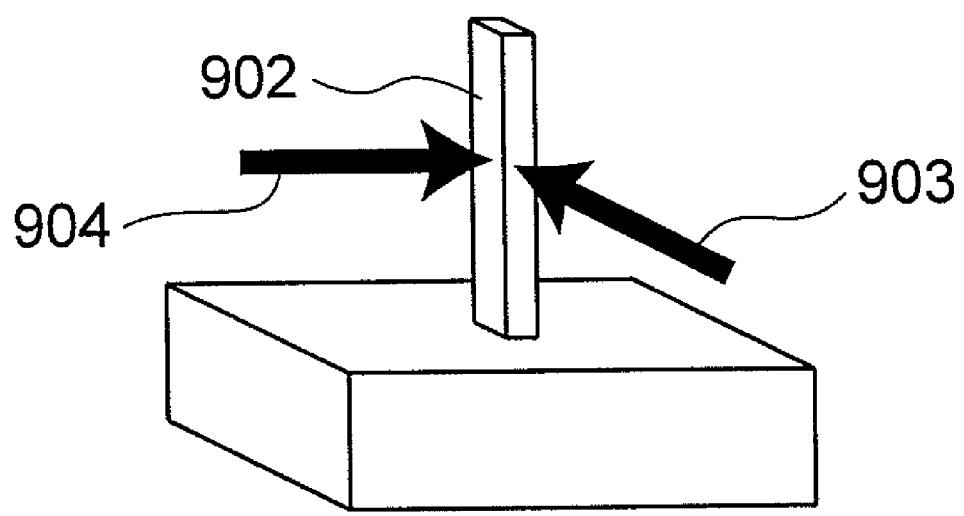

The specimen to be observed is not limited to a thin-film observing specimen 901 as shown in FIG. 9A but for example, may be an observing specimen 902 of upright pillar form as shown in FIG. 9B. In this instance, the pillar form is exemplified in FIG. 9B by a prism for simplicity of explanation but obviously this is not limitative. The above observing specimen 902 of upright form can in use be bombarded with charged particle beams typified by electron beams not only in a direction 903 frontally vertical to the specimen but also in a lateral direction 904 in the figure and information obtained upon bombardment in the latter direction can also be used for analysis and evaluation.

Embodiment 4

In the present embodiment, how to connect an external voltage applying portion of a specimen to a mesh electrode the specimen support (mesh) has will be described by making reference to FIGS. 10A to 10D.

Firstly, two kinds of methods for exposing the external voltage applying portion of a specimen to be measured to the surface of the specimen by taking a field effect transistor thin film specimen 1001 (hereinafter, simply referred to as a MOS thin film specimen 1001) as a specimen, for instance.

Figure 10A:
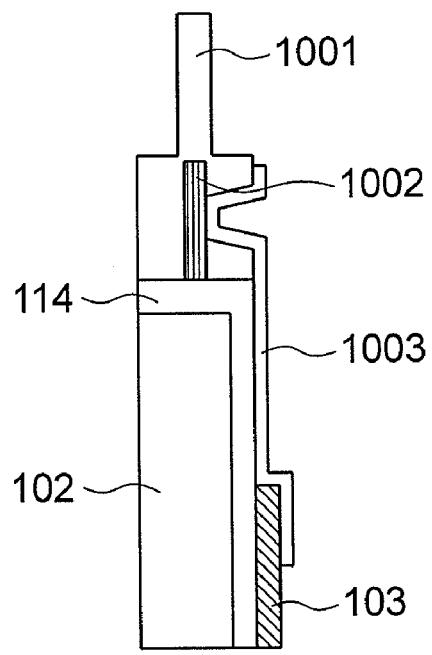
FIGS. 10A to 10D are diagrams showing embodiments of a method for electrically connecting electrodes laid on a specimen support to a specimen.

According to a first one of the methods, an ion beam is irradiated on a structure surrounding an external voltage applying portion to bore a hole in the surrounding structure to thereby permit either the external voltage applying portion or a interconnect included in the MOS thin film specimen to be exposed to the specimen surface. An MOS thin film specimen 1001 worked in advance through the micro-sampling process is fixed as shown in FIGS. 10A and 10B to a mesh 102 having a conductive structure and is then worked finely under the irradiation of a focused ion beam, thus ensuring that the interconnect included in the MOS thin film specimen 1001, that is, a plug 1002 can be exposed.

Figure 10C:
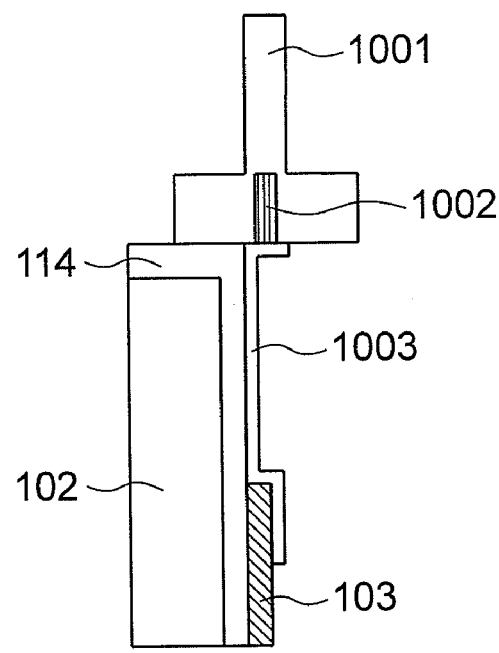
Figure 10B:
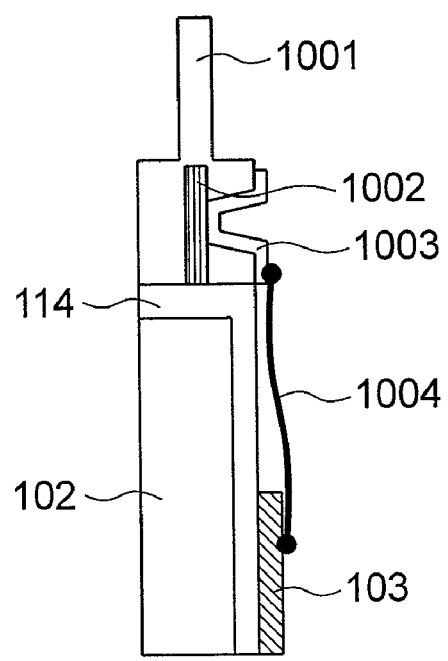
Figure 10D:
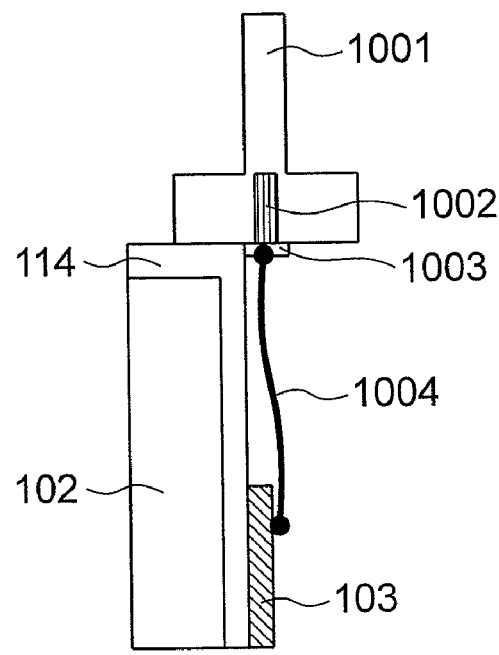

In a second one of the methods, a MOS thin film specimen 1001 is so placed as to be clear of a mesh 102 as shown in FIGS. 10C and 10D. An interconnect included in a MOS thin-film specimen 1001 worked through the micro-sampling process, that is, a plug 1002 is exposed in advance to the surface of the MOS thin film specimen 1001. Subsequently, the thus obtained MOS thin film specimen 1001 is fixed to the mesh 102. If at that time the plug 1002 exposed to the specimen surface is so attached as to be clear of the end of the mesh, the plug 1002 is not covered with the mesh 102 to keep exposed to the surface while the specimen being fixed to the mesh 102, so that the external voltage applying portion of the specimen to be measured can remain to be exposed to the specimen surface.

After an external voltage applying portion of a specimen to be measured has been exposed to the specimen surface in this manner, the exposed external voltage applying portion is connected to the mesh electrode. The external voltage applying portion referred to herein can include a conductive structure, interconnect, electrode, plug or substrate in a semiconductor device. Two kinds of method for connection will now be described below.

In a first one of the methods, a deposition film 1003 is formed between plug 1002 and mesh electrode 103 by using a focused ion beam to connect the two members as shown in FIGS. 10A and 10C. The deposition film 1003 may be formed through deposition of tungsten. More particularly, the deposition film 1003 can be formed by irradiating a focused ion beam onto an area on which the deposition film is desired to be formed while supplying a deposition gas from a deposition gas source. Since in this phase a secondary ion image can also be acquired simultaneously under the irradiation of the focused ion beam, a deposition film can be formed on a specified portion while observing and confirming the work condition of the specimen. Thanks to the thus formed deposition film, steady electrical connection can be set up over a wide area and a relatively large amount of current can be passed between the plug 1002 and the mesh electrode 103. The present technique is also advantageous in that the observing specimen preparation and the electric connection can be carried out consistently in a single apparatus.

In a second one of the methods, the connection between plug 1002 and mesh electrode 103 is established by a floating conductive structure 1004 as shown in FIGS. 10B and 10D. For the floating conductive structure 1004, a carbon nanotube or metal bonding may be used. A thinner conductive structure can be formed with the carbon nanotube than with the metal bonding but the allowable flowing current decreases. Contrarily, with the metal bonding used, the conductive structure becomes thicker than with the carbon nanotube but the allowable amount of current can be larger. Accordingly, the different types of conductive structure can be used selectively according to the purpose of measurement. In setting up the floating conductive structure 1004, the plug 1002 can be exposed to the surface to make electric connection of plug 1002 and the conductive structure 1004 easier. For example, by depositing tungsten, a deposition film 1003 may be provided.

In case the mesh 102 scheduled to be attached with an observing specimen (corresponding to the MOS thin-film specimen 1001 in FIGS. 10A to 10D) is made of an electrically conductive material, an insulator 114 may preferably be interposed between the observing specimen and the mesh 102 to electrically isolate the observing specimen from the mesh. Further, as has been described in connection with embodiment 2, the mesh electrode 103 needs to be electrically isolated from the mesh body and therefore the insulator 114 may preferably be interposed between the mesh electrode 103 and the mesh 102 so as to electrically isolate the specimen to be observed from the mesh. If a mesh made of an insulating or dielectric material is used, electrical isolation can be assured between the mesh and the observing specimen and between the mesh and the mesh electrode 103 and so the insulator 114 need not be provided.

Embodiment 5

Figure 11A:
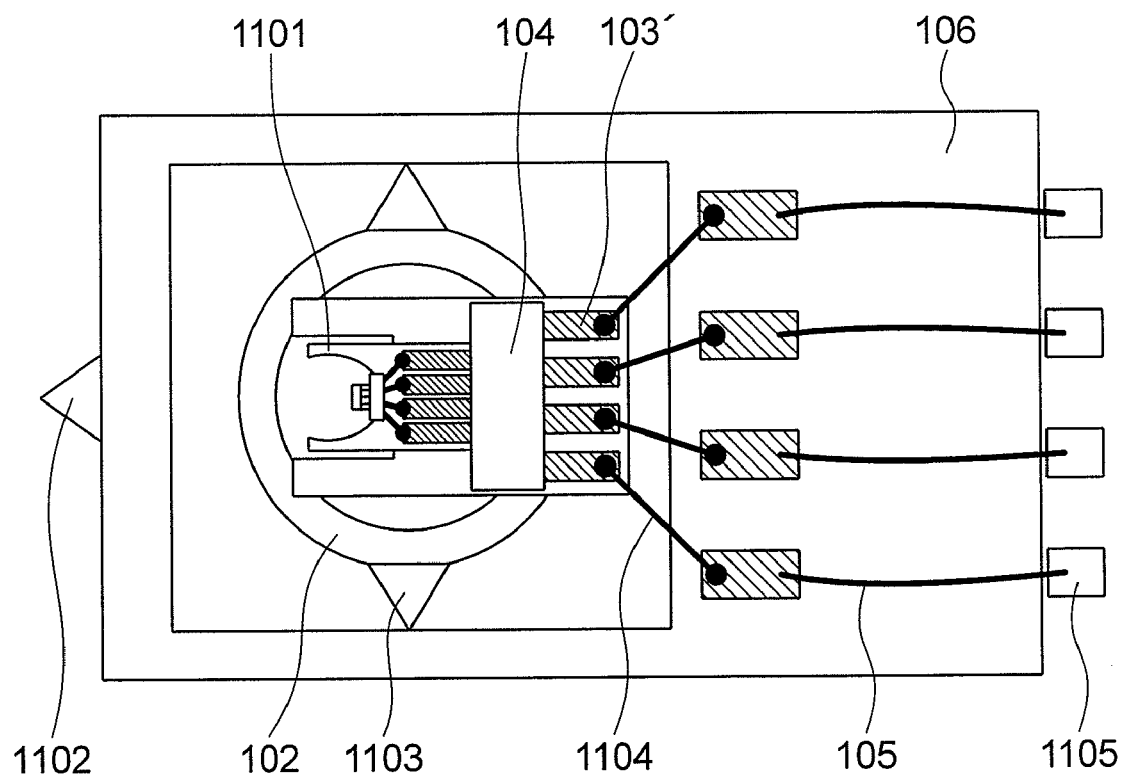
FIGS. 11A and 11B are a plan view and a side view, respectively, showing an embodiment of a specimen holder for electron microscope.
Figure 11B:
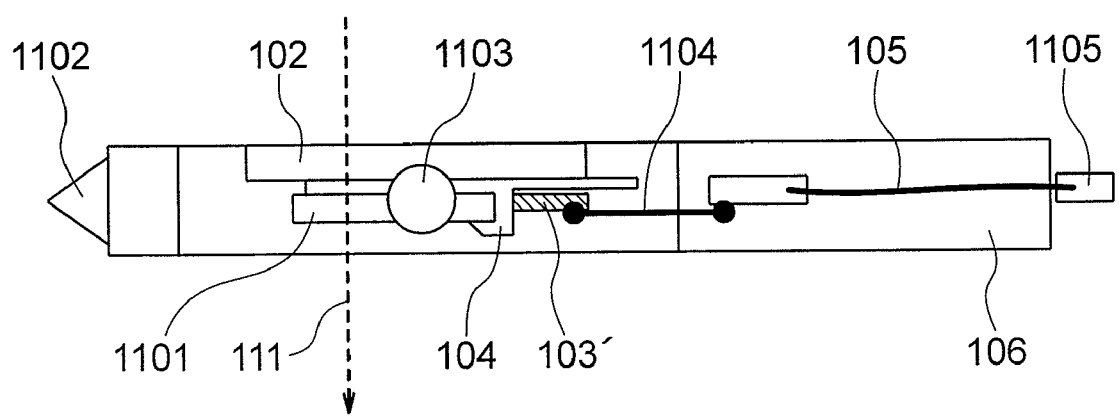

Referring to FIGS. 11A and 11B, an embodiment of the specimen holder used in the electron microscope will be described and referring to FIG. 12, an embodiment of the electron microscope representing a charged particle beam apparatus will also be described. A description will be given of the electron microscope by way of example of a scanning transmission electron microscope but this is not limitative and a transmission electron microscope or a scanning electron microscope may of course be handled.

In the embodiment of the specimen holder used in the electron microscope shown in FIGS. 11A and 11B, a specimen to be observed, a mesh and a specimen holder are illustrated in FIG. 11A as viewed in the optical axis direction of electron microscope (as viewed from the fluorescent screen to the electron gun) and they are illustrated in FIG. 11B as viewed in a direction vertical to the optical axis of electron microscope (as viewed sidewise).

In FIGS. 11A and 11B, the observing specimen is fixed to the mesh provided with a mesh electrode. This assembly is then mounted on the specimen holder 106. At that time, the specimen is not seated directly on the specimen holder and specimen stand but the mesh provided with the mesh electrode serving as an intermediate medium is intervened, with the result that the size conversion between "the specimen stand and specimen holder and the specimen" can be divided so as to be carried out through two steps of "between the specimen stand and specimen holder and the mesh" and "the mesh and the specimen". Thus, all an operator has to do is accurately positioning the "mesh" on the specimen holder and specimen stand and therefore, the figure or degree of size conversion for one step on the specimen holder can be reduced in comparison with positioning of a fine "specimen" on the specimen holder and specimen stand. Accordingly, positioning on the specimen holder can be facilitated.

The mesh is so shaped as to have a form which is easy to mount/dismount to/from a socket and hereinafter this type of mesh is particularly called a cartridge 1101. Upon specimen exchange, the cartridge 1101 is dismounted from the specimen holder 106 and a new cartridge 1101 is fixedly mounted to the specimen holder 106, thus ending a specimen exchange process which is completed easily and within a short period of time.

The specimen holder 106 is provided with a rotary pivot 1102. The cartridge 1101 is also provided with tilting pivots 1103 at diametrically opposite edges. With this construction, the cartridge 1101 can be rotated and tilted about the rotary pivot and the tilting pivots, respectively. By rotating and tilting a specimen to be observed through the two types of pivots, the charged particle beam typified by the electron beam can be incident on the specimen at a desired angle.

Next, by using transit members 1104 provided on the specimen holder, a mesh electrode 103 is electrically connected to a specimen holder electrode 105. Since the specimen holder electrode 105 is connected to current inlet terminals 1105, electrical connection between the current inlet terminal 105 and the external voltage applying portion of specimen can be established. Structurally, in the present embodiment, four current inlet terminals are arranged independently and therefore, voltages can be applied externally to the respective external voltage applying portions of the specimen independently.

Further, for prevention fall-off of the cartridge 1101 from the socket 104, a contrivance for fixing the cartridge 1101 to the socket 104 can be applied. In the present embodiment, the contrivance explained in connection with the FIG. 4 embodiment can be employed in such a way that tap screw 113 is used to directly screw the mesh cap 112 to the specimen holder 106.

In the present invention, external voltage is applied to the specimen through the conductive structures provided for the mesh and the specimen holder. Accordingly, in contrast to the method in which after many probes are brought into contact with the specimen surface, external voltage is applied, the three-dimensional shape of a probe abutting the specimen need not be considered and the degree of freedom of wire setting to the specimen can be promoted. This is particularly advantageous when many conductors are wired to a fine specimen. Because the probe abutting the specimen is unnecessary, no mechanical force is applied to the specimen. Accordingly, the possibility that the specimen per se will be deformed to affect characteristics of the device or the specimen will be broken in the course of measurement can be avoided and the handling can be facilitated.

Figure 12:
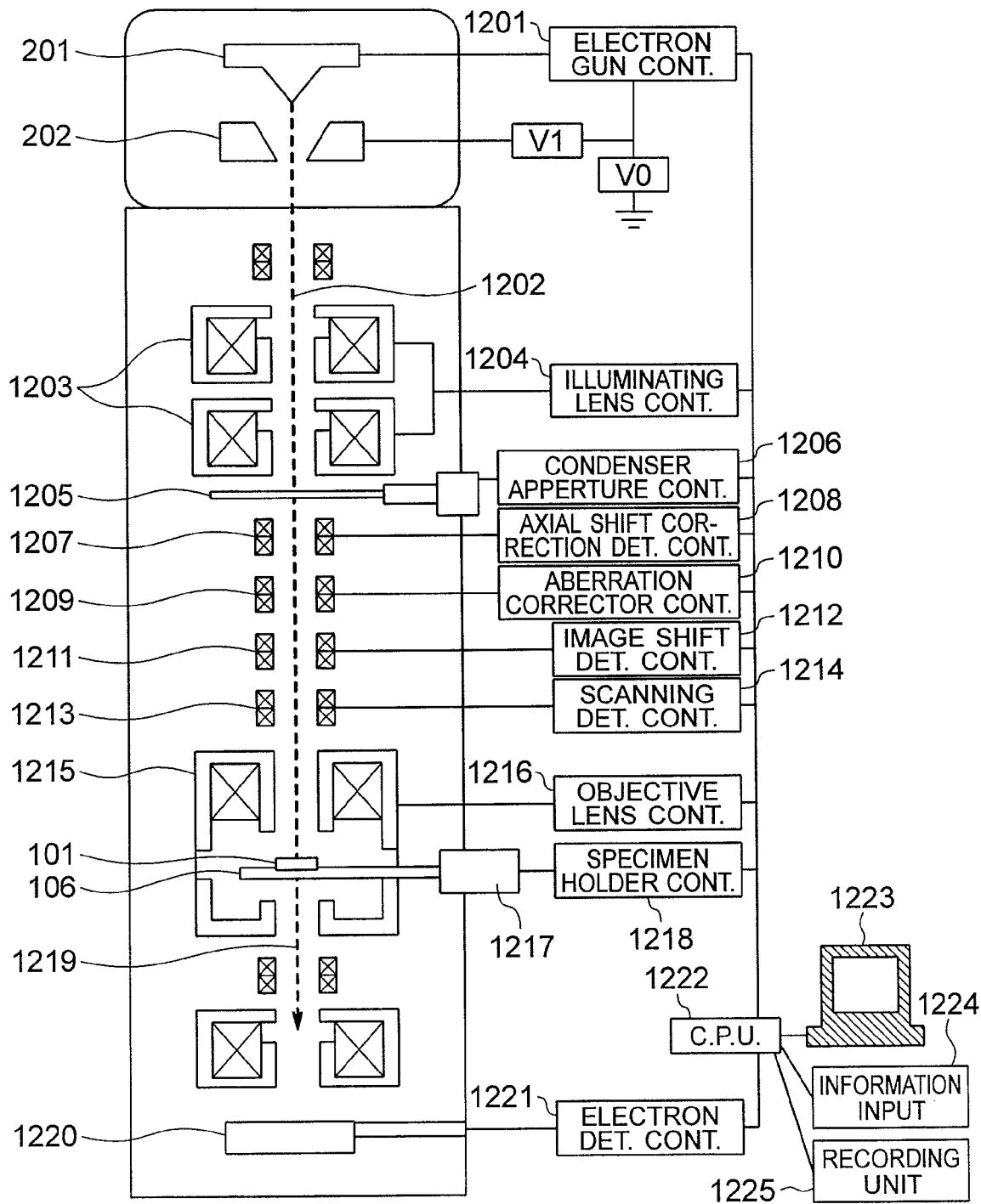
FIG. 12 is a schematic diagram showing an embodiment of an electron microscope for performing evaluation.

Turning to FIG. 12, an embodiment of observation carried out with a scanning electron microscope will be described. A primary electron beam 1202 emitted from an electron gun 201 is focused and irradiated on a specimen to be observed by means of an illuminating optical system including an anode 202, an illuminating lens 1203, a condenser aperture 1205, an axial shift correction deflector 1207, an aberration corrector 1209, an image shift deflector 1211 and an objective lens 1215. The illuminating optics can be controlled by a control system including an electron gun control circuit 1201, an illuminating lens control circuit 1204, a condenser aperture control circuit 1206, an axial shift correction deflector control circuit 1208, an aberration corrector control circuit 1210, an image shift deflector control circuit 1212 and an objective lens control circuit 1216.

While the primary electron beam being scanned two-dimensionally on the specimen surface by means of a scanning deflector 1213, the intensity of a transmission electron beam is detected with an electron detector 1220 and can be displayed as an image on a display unit 1223 synchronously with scanning positions through the medium of an electron detector control circuit 1221 and a central processing unit 1222, so that a transmission electron beam image contrasted in accordance with the composition of a specimen structure and the state of electrons can be displayed on the display unit 1223. The mesh can be rotated and tilted about two axes by means of two types of pivots. Further, a current inlet terminal added specimen holder drive mechanism 1217 is controlled by the central processing unit 1222 by way of a current inlet terminal added specimen holder drive mechanism control circuit 1218. The operator can input a variety of parameters useful for analysis/evaluation of the specimen by using an information input means 1224. The information input means may include a touch panel, a keyboard and a mouse, for example, and the parameter may include, for example, a position of the specimen (in x direction, y direction and z direction), a rotation/tilt angle of the specimen, a value of voltage applied to the specimen and a value of current passed to the specimen. The parameter inputted from the information input means 1224 is controlled by the central processing unit 1222 and conditions the parameter takes can be displayed sequentially on the display unit 1223 or recorded on a recording unit 1225.

Embodiment 6

Figure 13:
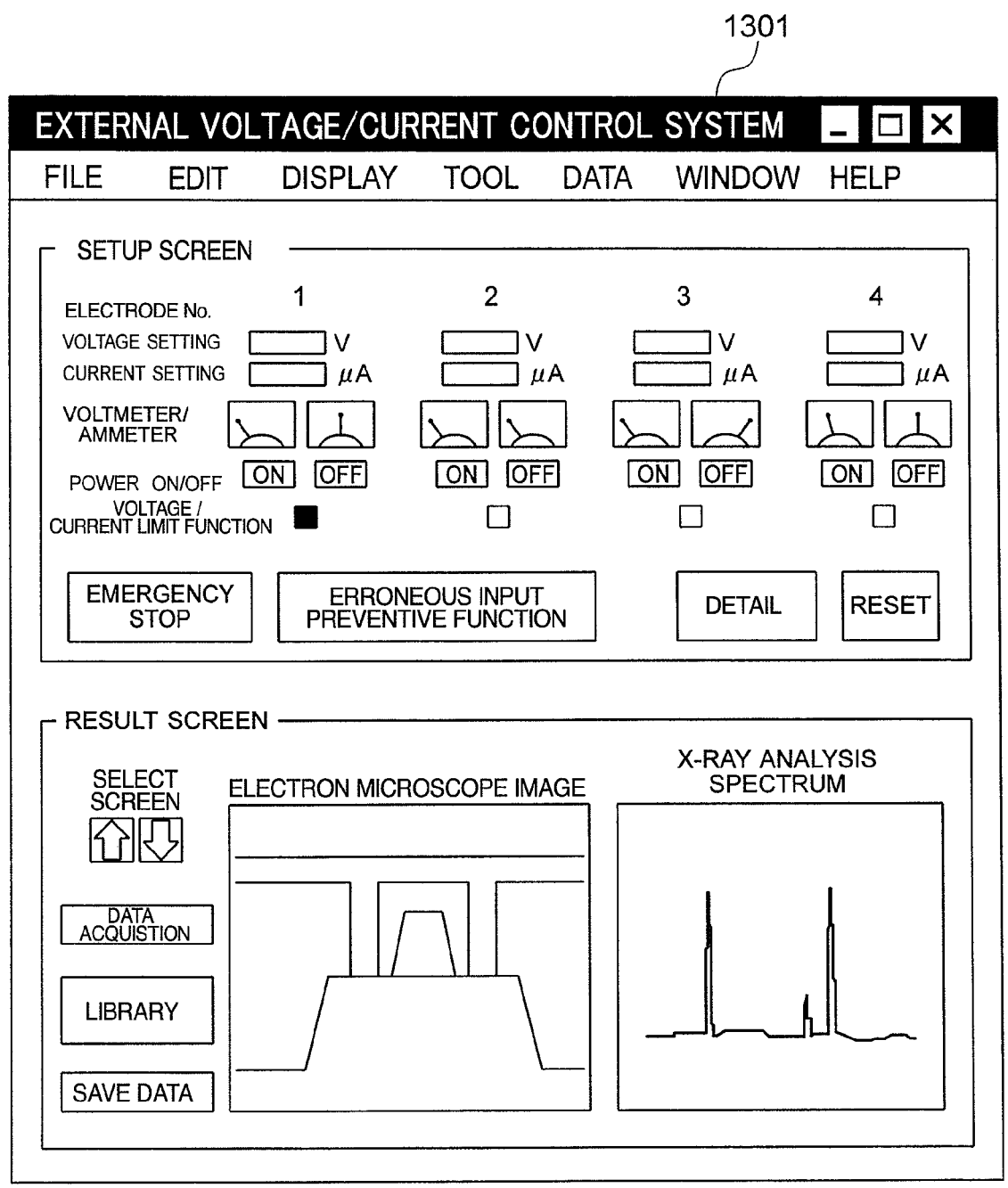
FIG. 13 is a diagram showing an embodiment of an operation screen displayed on a display unit.

By making reference to FIGS. 12 and 13, a description will be given of an embodiment of operation screen and operation method necessary for external voltage application presented on the display unit 1223 in the specimen analyzing apparatus described in embodiment 5. Illustrated in FIG. 13 is an example of an external voltage/current application system 1301 (hereinafter simply referred to as a system). In the system, a "setup screen" for setting various parameters may be provided. For the setup screen, a means for inputting various parameters can be arranged and the various parameters may be information necessary for operating the specimen analyzing apparatus or determining voltage or current values of the external power supply, including partly or totally, for example, beam current, focus, exposure meter, ammeter for beam current, magnification, the kind of camera to be used, excitation condition, position of the specimen (x direction, y direction and z direction), rotation/tilt angle of the specimen, voltage value applied to the specimen and current value flowing into the specimen. As the means for inputting the parameter, a knob, a button, a meter, an input space for directly inputting a set value or a pull-down may be used. In FIG. 13, four channels of DC external power supply can be operated independently but the number of channels is not always limited to four and the external power supply to be connected to the specimen may alternatively be an AC power supply or a DC power supply superimposed on an AC power supply.

The operator can operate the parameter input means provided in the system by using the information input means 1224 to set or change the various kinds of parameters. The set or changed various parameters can be controlled by the central processing unit 1222 so as to be used as analysis/evaluation conditions in the specimen analyzing apparatus.

In addition to the "setup screen", a "result screen" for indication of results of analysis/evaluation of the specimen can be displayed concurrently in the system as above in order for the operator to conveniently perform the parameter setting and to study the analysis/evaluation results on the single screen. On the "result screen", various kinds of data may be displayed including images taken and spectra acquired in the course of the analysis/evaluation work and past data stored in the recording unit 1225 as well. On the screen presented in the system, the "setup screen" and "result screen" may be displayed concurrently or as necessary, any desired one of these screens may be displayed.

If the voltage value applied to the specimen or the current value flowing into the specimen by way of the conductive structures formed on the mesh and specimen holder increases, there arises a problem that not only the conductive structures formed on the mesh and specimen holder but also the specimen per se is broken. Therefore, an "erroneous input preventive function" to monitor the parameter (voltage value applied to the specimen or current value flowing to the specimen) which is inputted to and set or changed on the "setup screen" may be incorporated with the aim of forcibly making the voltage value or current value zero or rewriting it to less than a predetermined value in the event that the applying voltage value or current value is about to be set in excess of the predetermined value. Also, a "voltage/current limit function" to monitor a voltage value actually applied to the specimen or a current value actually flowing into the specimen may be incorporated with a view to disconnecting the connection between the specimen and the external power supply or lowering a voltage value or current value to below a voltage setting value or current setting value in the event that a voltage in excess of the voltage setting value is applied to the specimen or a current in excess of the current setting value flows into the specimen.

Embodiment 7

In the present embodiment, a method will be described which suppresses electrification due to the irradiation of an electron beam in the electron microscope representing a charged particle beam apparatus. In the present invention, for the purpose of applying external voltage to a specimen to be observed, electrical connection is established between external voltage applying portions of the specimen to be measured and current inlet terminals of a specimen holder through the medium of mesh electrodes and specimen holder electrodes provided therebetween. Although the electron beam is required to be transmitted through a thin-film specimen in order to perform analysis based on the transmission electron microscope, direct electron beam irradiation on a location unrelated to the analysis/evaluation (for example, a portion of specimen not undergoing analysis/evaluation, an interconnect included in the specimen and the mesh electrodes and specimen holder electrodes are enumerated) is desired to be avoided.

An example of prevention of direct electron beam irradiation on a location unrelated to the analysis/evaluation has already been described as including the method in embodiment 2 according to which to avoid direct electron beam irradiation on the mesh electrode, part or whole of conductive films is surrounded by an insulating film or part or whole of conductive films is sandwiched between two sheets of mesh to provide a mesh electrode so that the mesh electrode set in the mesh may be prevented from being exposed to the outside. In a method according to the present embodiment, however, a conductive film for blocking an electron beam is provided for the mesh or the like as will be described below. Three kinds of embodiments for suppression of electrification attributable to electron beam irradiation will be described with reference to FIGS. 14, 15 and 16. These embodiments will be described as using the transmission electron microscope, for instance, but this is not limitative.

Figure 14A:
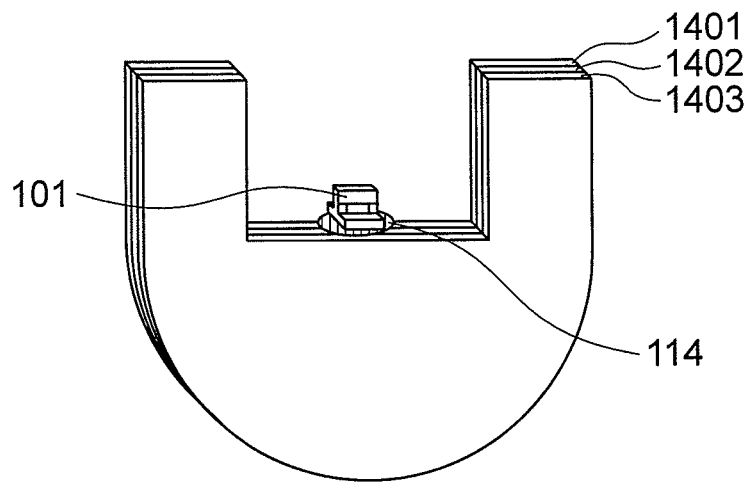
FIGS. 14A to 14C are diagrams useful to explain an embodiment of a method for suppressing electrification due to electron beam irradiation.

A first one of the embodiments directed to a method of providing an electron beam blocking conductive film 1403 on a mesh substrate 1401 will be described with reference to FIGS. 14A to 14C. Illustrated in FIG. 14A is a diagram as viewed from the front side of the mesh. Firstly, in order to newly provide a mesh insulating film 1402 and the electron beam blocking conductive film 1403 on the mesh substrate 1401, a metal sheet is bonded to the mesh substrate 1401 by using low conductivity or non-conductive bonding agent to let the metal sheet impersonate the electron beam blocking conductive film 1403 and let the boding agent between the metal sheet and the mesh impersonate the mesh insulating film 1402. If the mesh substrate 1401 is made of an insulating material, the electron beam blocking conductive film 1403 has already been electrically isolated from the mesh substrate 1401 and the mesh insulating film 1402 can be dispensed with to make fabrication easier.

Figure 14B:
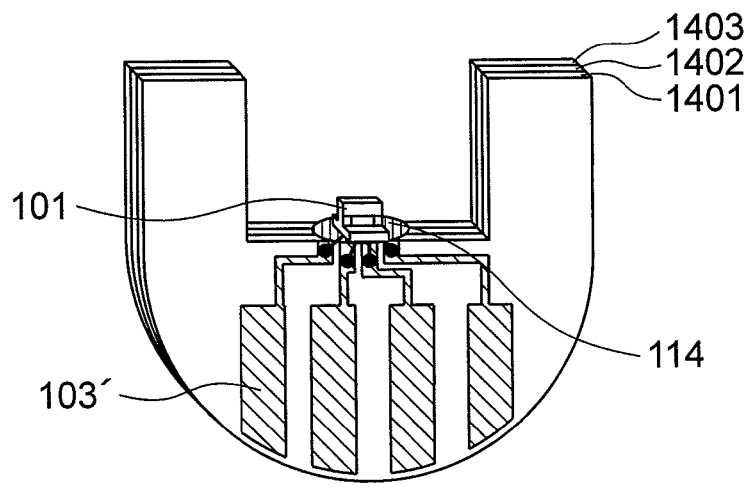

In such a case, another embodiment as shown in FIG. 14B can be applied in which independent mesh electrode 103' are provided on only the rear surface of the mesh. Then, as shown in FIG. 14C, a socket electrode 1404 adapted to connect the electron beam blocking conductive film to ground is newly provided inside the socket. Thereafter, the socket electrode 1404 for connection to the electron beam blocking conductive film is grounded. For example, the socket electrode 1404 for connection of the electron beam blocking conductive film is electrically connected to one of the conductive structures of specimen holder electrode 105 and the specimen holder electrode is connected to the microscope proper through the medium of current inlet terminals on the specimen holder, followed by fitting of the mesh into the socket 104 in the arrow direction, so that the electron beam blocking conductive film 1403 can be grounded easily by way of the socket electrode 1404 for connection to the electron beam blocking conductive film, the specimen holder electrode 105 and the current inlet terminal.

Figure 14C:
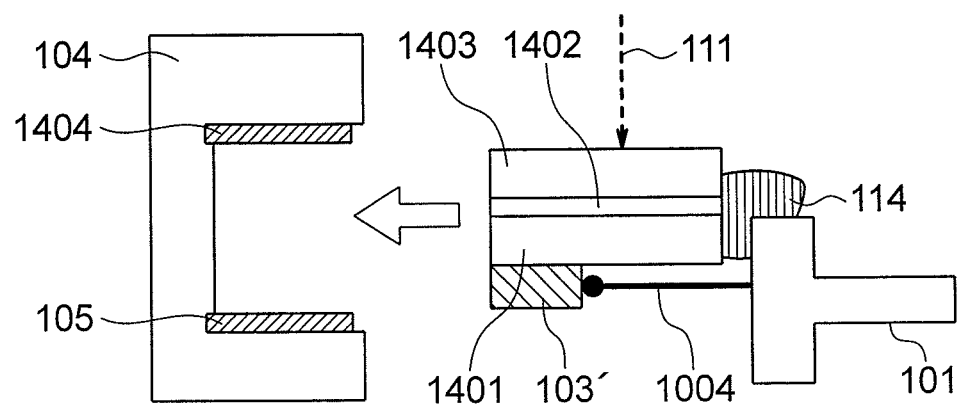

By incorporating the mesh such that the surface covered with the electron beam blocking conductive film 1403 confronts the electron gun and the independent mesh electrode 103' is laid rearwards in the electron microscope, the electron beam going to land on the mesh during analysis can be blocked by the electron beam blocking conductive film as shown in FIG. 14C.

Figure 15A:
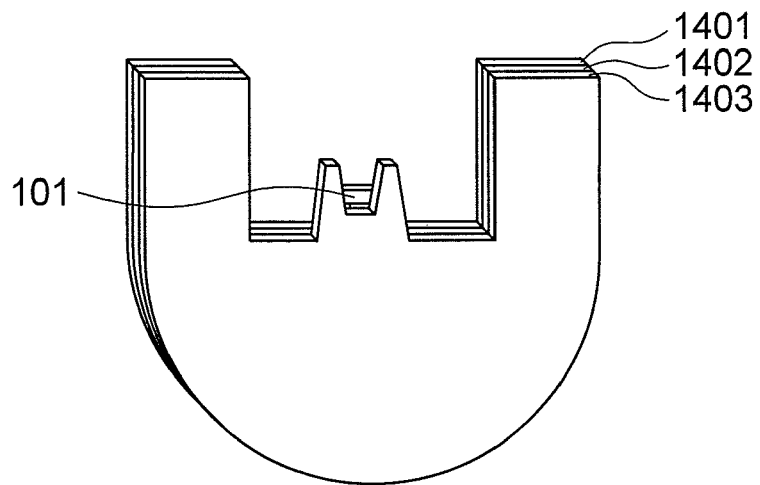
FIGS. 15A to 15C are diagrams useful to explain another embodiment of the method for suppressing electrification due to electron beam irradiation.
Figure 15B:
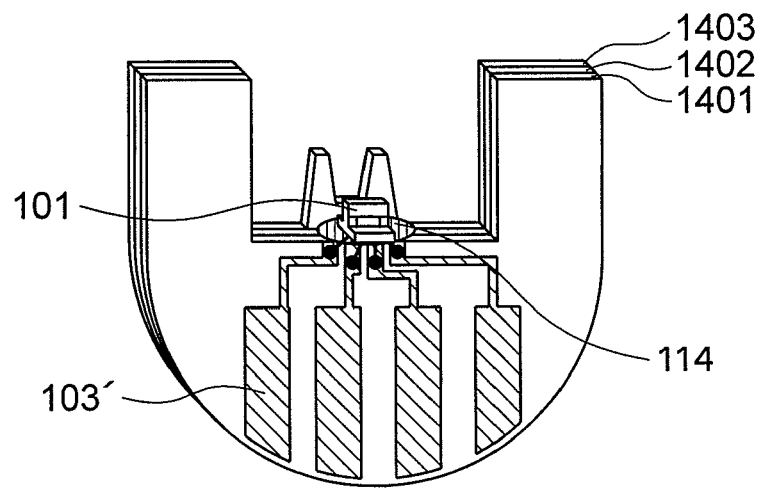
Figure 15C:
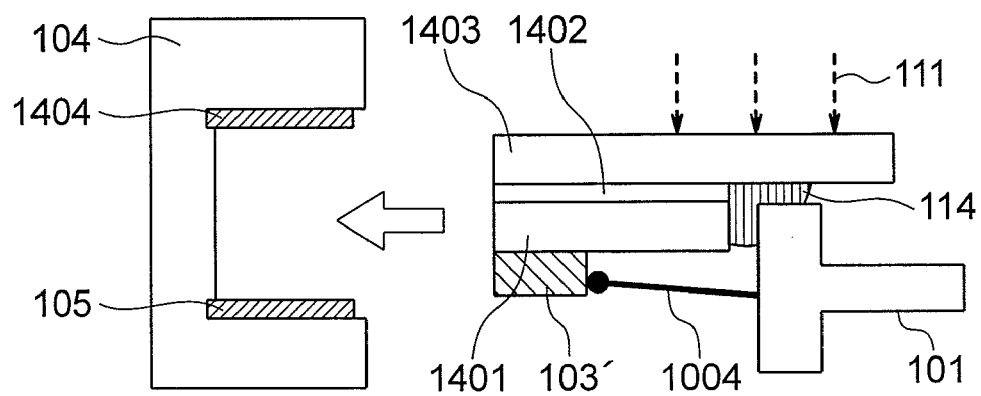

In a second one of the methods starting from the first one, the electron beam blocking conductive film 1403 is additionally formed with a dovetail-like fitting arrangement corresponding to that of a specimen as shown in FIGS. 15A to 15C. With this construction, the electron beam about to land on the mesh during the specimen analysis can be blocked by the electron beam blocking conductive film 1403. Further, by suitably selecting the dovetail-like fitting arrangement of the electron beam blocking conductive film and the mounting position of the specimen, an electron beam going to land on a location on the specimen where the analysis is unneeded can also be blocked by the electron beam blocking conductive film 1403.

Figure 16A:
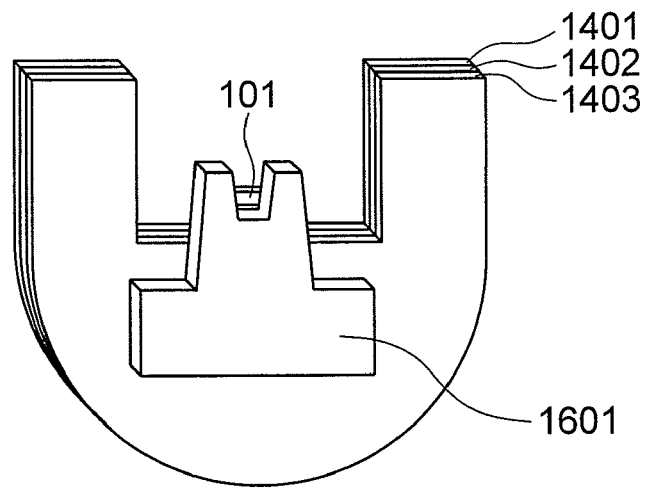
FIGS. 16A to 16C are diagrams useful to explain still another embodiment of the method for suppressing electrification due to electron beam irradiation.
Figure 16B:
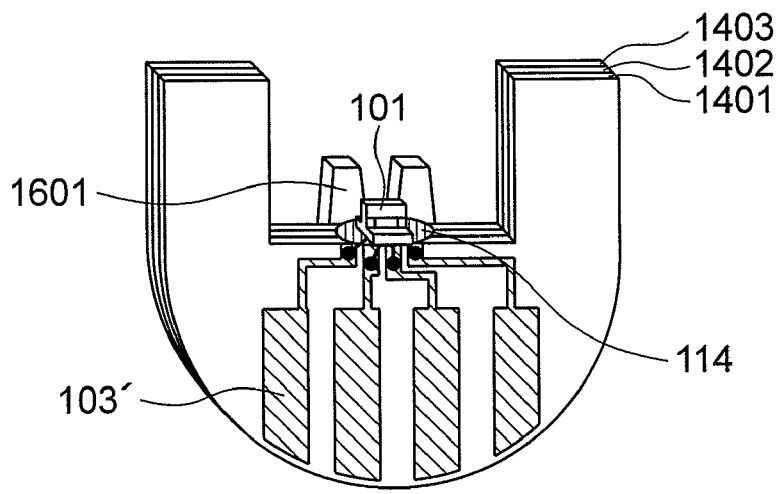
Figure 16C:
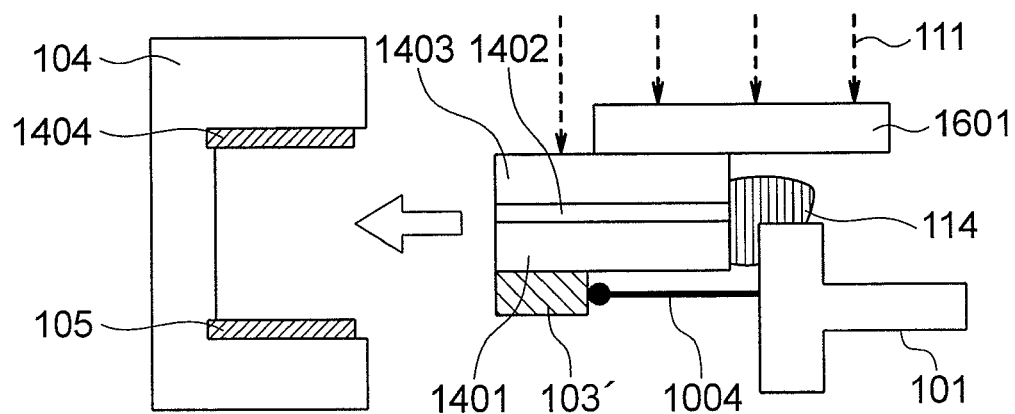

In a third one of the method, a specimen shielding cover 1601 is additionally provided for the electron beam blocking conductive film 1403 as shown in FIGS. 16A to 16C. To provide the specimen shielding cover 1601 with the function to block the electron beam, part or whole of the surface of specimen shielding cover is formed with a conductive film as in the case of the first and second ones of the method and thus formed conductive film is grounded. The specimen shielding cover 1601 may be produced by either cutting a metal sheet or taking out the specimen shielding cover from a wafer or a chip specimen through micro-sampling process and depositing a film on the specimen shielding cover to form a conductive film thereon. Then, the specimen shielding cover 1601 is set on the mesh. At that time, the conductive film provided for the specimen shielding cover is electrically connected to the electron beam blocking conductive film 1403 provided for the mesh. Subsequently, like the procedure in the first one method, the mesh is built in the specimen holder as shown in FIG. 16C and at the same time, the conductive film of specimen shielding cover is grounded through the socket electrode 1404 for connection of the electron beam blocking conductive film. Through this, the electron beam about to land on the mesh during specimen analysis can be blocked by means of the electron beam blocking conductive film and if the shape and attachment position of the specimen shielding cover is selected suitably, an electron beam going to land on a portion of specimen where the analysis need not be conducted can also be blocked by the specimen shielding cover 1601.

Embodiment 8

In the present embodiment, an example of a method for connection of a device specimen to the mesh in actual device measurement will be described. A description of the method will be given by way of a mere example of the specimen represented by a device chip or a thinned field effect transistor 1701 which is cut out of a semiconductor wafer. During thin-filming, the external voltage applying portions or the interconnect included in the specimen is exposed to the specimen surface in advance in accordance with the method described in connection with, for example, embodiment 3.

Figure 17:
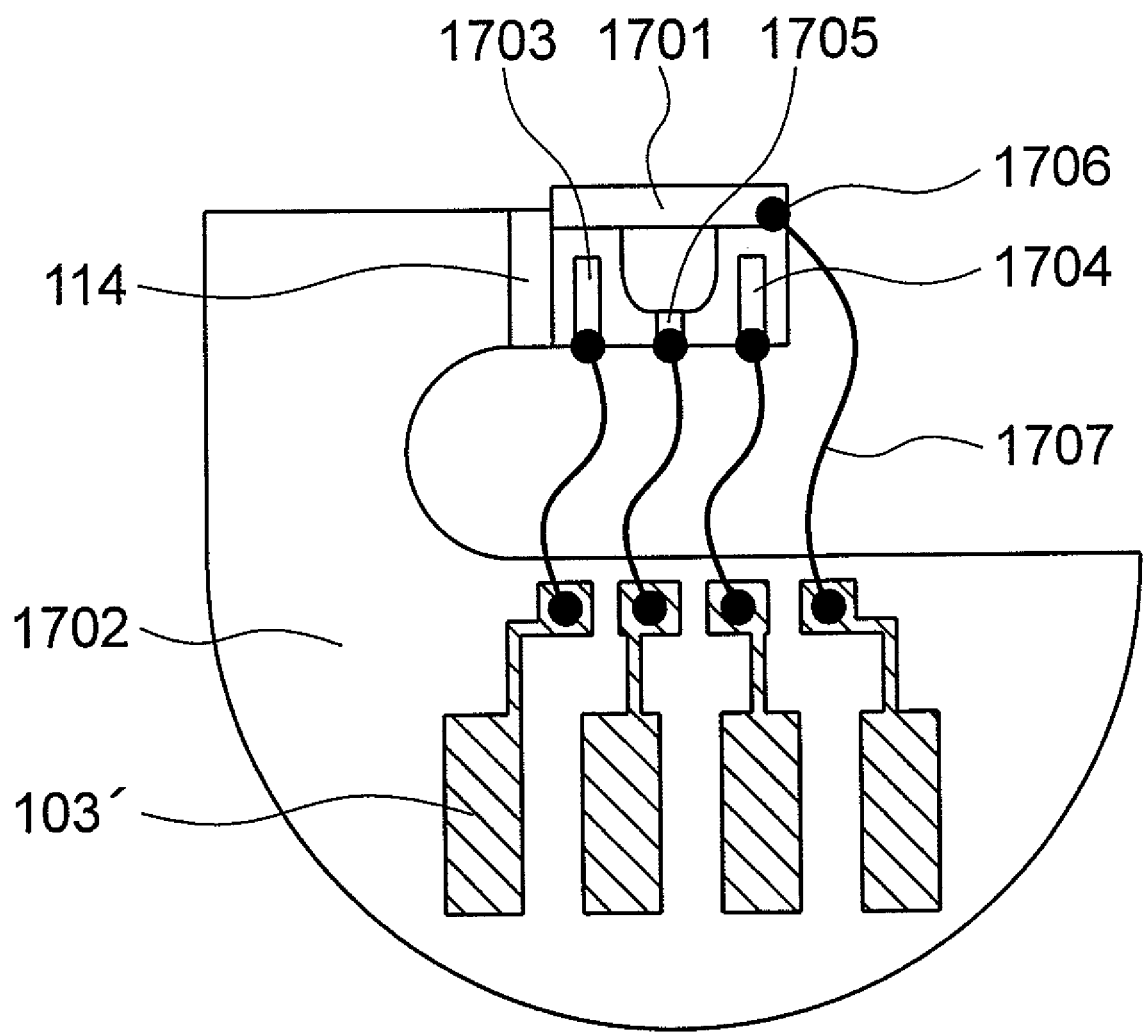
FIG. 17 is a diagram useful to explain an embodiment of specimen evaluation.

An embodiment of specimen evaluation will be explained with reference to FIG. 17. A specimen is fixed to a C-shaped mesh 1702 having a conductive structure/pattern on its surface. In other embodiments described so far, after the specimen has been turned upside down during the specimen preparation based on the micro-sampling process, the specimen is fixed such that its side opposite to the substrate can come into contact with the mesh but in the present embodiment, the "side surface" of a thin-film specimen is fixed to the C-shaped mesh 1702. Subsequently, external voltage applying portions of a interconnect included in the thin-film specimen, that is, source 1703, drain 1704, gate 1705 and ground 1706 are connected to respective independent mesh electrode 103' through respective floating wire conductors 1707. For the floating wire conductor 1707, a carbon nanotube or wire bonding may be used. The C-shaped mesh 1702 is employed herein but the mesh shape is not limited to the C-letter form. The number of channels of conductive structure/pattern as exemplified herein to four is not limitative but may be selected properly according to the purpose of measurement.

In case the mesh to which the specimen to be observed is set is made of an electrically conductive material, an insulating member 114 may be interposed between the observing specimen and the mesh to electrically isolate the observing specimen from the mesh. For example, by using a bonding agent of low electric conductivity or of dielectric strength, the specimen to be observed may be fixed to the mesh. In another method, a sufficiently thick oxide film may be formed on the surface of the mesh and the specimen to be observed may be fixed to the oxide film. In case a mesh made of an insulating material is adopted, the specimen has already been isolated electrically from the mesh and therefore the interposition of the insulating member 114 between the observing specimen and the mesh can be unneeded.

The present invention can be applicable to the semiconductor industry including analysis in the semiconductor device and the measuring apparatus industry typified by the specimen analyzing apparatus including the electron microscope and ion beam apparatus.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A specimen analyzing apparatus comprising:
   a charged particle beam illuminating optical system for irradiating a charged particle beam on a specimen;
   a detector for detecting a secondary charged particle beam generated under the irradiation of the charged particle beam;
   a specimen attachment having a pass-through portion for allowing the charged particle beam to pass; and
   a specimen holder for mounting the specimen attachment,
   wherein the specimen attachment mounts the entire specimen in the pass-through portion,
   wherein the specimen attachment includes a conductive pattern having a first part and a second part whose pattern width is narrower than a pattern width of the first part,
   wherein the conductive pattern is electrically connectable to the specimen holder via the first part and is electrically connectable to said specimen via the second part,
   wherein the first part is connected to the second part by the conductive pattern whose pattern width is narrower than a pattern width of the first part,
   wherein the second part faces the pass-through portion, and
   wherein the conductive pattern is disposed on an opposite side of the specimen attachment relative to the charged particle beam illuminating optical system;
   a conductive deposition film formed on the specimen holder;
   a floating conductive structure having a first end connected to the second part, and a second end connected to the deposition film,
   wherein the conductive deposition film is disposed on the opposite side of the specimen attachment relative to the charged particle beam illuminating optical system.

2. A specimen analyzing apparatus comprising:
   a charged particle beam illuminating optical system for irradiating an electron beam on specimen;
   a detector for detecting electrons transmitted through said specimen under irradiation of said electron beam;
   a specimen attachment having a pass-through portion for allowing the charged particle beam to pass;
   a specimen holder for mounting the specimen attachment;
   a first conductive pattern formed on the specimen holder;
   a second conductive pattern formed on the specimen attachment for converting a predetermined size electrode pattern connectable to the first conductive pattern to a second electrode pattern connectable to said specimen, the second electrode pattern width is narrower than the predetermined size electrode pattern; and
   means for supplying voltage or current to said specimen through the first conductive pattern and the second conductive pattern,
   wherein the specimen attachment mounts the entire specimen in the pass-through portion,
   wherein the predetermined size electrode pattern is connected to the second electrode pattern by the second conductive pattern whose pattern width is narrower than a pattern width of the predetermined size electrode pattern,
   wherein the second electrode pattern faces the pass-through portion,
   wherein the second conductive pattern is disposed on an opposite side of the specimen attachment relative to the charged particle beam illumination system; and
   a conductive deposition film formed on the specimen holder; and
   a floating conductive structure having a first end connected to the smaller size electrode, and a second end connected to the deposition film,
   wherein the conductive deposition film is disposed on the opposite side of the specimen attachment relative to the charged particle beam illuminating optical system.

3. A specimen analyzing apparatus according to claim 1, wherein said specimen attachment has a single or a plurality of conductive structures.

4. A specimen analyzing apparatus according to claim 1, wherein an insulating member is interposed between said specimen attachment and said specimen.

5. A specimen analyzing apparatus according to claim 1, wherein said specimen attachment is formed with a dovetail-like fitting arrangement and said specimen holder is formed with a corresponding dovetail-like fitting arrangement so that they may be put together through the dovetail-like fitting arrangements.

6. A specimen analyzing apparatus according to claim 1, wherein said specimen attachment has on its front surface a conductive film which is grounded.

7. A specimen analyzing apparatus according to claim 1, wherein a grounded conductive cover is provided for the front surface of said specimen attachment.

8. A specimen analyzing apparatus according to claim 6, wherein an insulating member is interposed between said conductive film and said specimen attachment.

9. A specimen analyzing apparatus according to claim 7, wherein an insulating member is interposed between said cover and said specimen attachment.

10. A specimen analyzing apparatus according to claim 1 further comprising means for applying voltage to said specimen through the conductive pattern.

11. A specimen analyzing apparatus according to claim 1 further comprising:
    means for imaging a signal detected by said detector; and
    display means for displaying the image.

12. A specimen analyzing apparatus according to claim 1, wherein said specimen holder is a side entry type specimen holder usable in common with a specimen preparation unit for producing said specimen.

13. A specimen analyzing apparatus according to claim 1, wherein said specimen attachment is usable in common with a specimen preparation unit for producing said specimen.

14. A specimen analyzing apparatus according to claim 1, wherein:

the second part is electrically connected to said specimen by means of a conductive deposition film; and the conductive deposition film is disposed on the opposite side of the specimen attachment relative to the charged particle beam illuminating optical system.

15. A specimen analyzing apparatus according to claim 2, wherein:

the smaller size electrode is electrically connected to said specimen by means of a conductive deposition film; and the conductive deposition film is disposed on the opposite side of the specimen attachment relative to the charged particle beam illuminating optical system.

* * * * *